United States Patent
Bull et al.

(10) Patent No.: US 6,670,799 B1
(45) Date of Patent: Dec. 30, 2003

(54) OPTICAL CURRENT MEASURING FOR HIGH VOLTAGE SYSTEMS

(75) Inventors: Jeffery David Bull, Vancouver (CA); Nicolas August Fleming Jaeger, Vancouver (CA); Farnosh Rahmatian, Vancouver (CA)

(73) Assignee: NXT Phase Corporation, Vancouver (CA)

( * ) Notice: Subject to any disclaimer, the term of this patent is extended or adjusted under 35 U.S.C. 154(b) by 0 days.

(21) Appl. No.: 09/563,426

(22) Filed: May 3, 2000

(51) Int. Cl.$^7$ .......................... G01R 19/00; G01R 31/00
(52) U.S. Cl. ...................... 324/76.11; 324/96; 324/127
(58) Field of Search ............................ 324/76.11, 96, 324/127

(56) References Cited

U.S. PATENT DOCUMENTS

| | | | |
|---|---|---|---|
| 3,662,263 A | 5/1972 | Bensel | 324/96 |
| 4,070,572 A | 1/1978 | Summerhayes | 324/96 |
| 4,376,247 A | 3/1983 | Humphrey | 324/96 |
| 4,471,355 A | 9/1984 | Hardy et al. | 324/96 |
| 4,629,979 A | 12/1986 | Missout et al. | 324/126 |
| 4,894,609 A | 1/1990 | Fujiki et al. | 324/96 |
| 5,012,182 A | 4/1991 | Fujiki et al. | 324/127 |
| 5,029,273 A | 7/1991 | Jaeger | 324/96 |
| 5,103,164 A | 4/1992 | Kawaguchi et al. | 324/127 |
| 5,420,504 A | 5/1995 | Berkcan | 324/127 |
| 5,446,372 A | 8/1995 | Berkcan | 324/127 |

OTHER PUBLICATIONS

Optical Correal Transducers for Power Systems A Review IEEE Transactions on Power Delivery vol. 9 No. 4 Oct. 1994.

Fibre Optic System for Three–Pase current sensing using a hybrid sensory Techniques McGarrity etal Rev. Sci Instrum 63(3) Mar. 1992 see attache list.

Integrated Electro–Optic High Voltage Sensors Jaeger & Rahmatian Optical Sensors for Utility & T.D. Applications Workshop Jul. 20–21, 1995, Portland Oregon.

Using Rogowski coils for transient current measurements Ward & Exon Engineering Science and Education Journal Jun. 1993.

Voltage and Current Sensors for a 1200KV Gas Insulated Bus Carlson and Fisher CH1139–5/79/0000–0200 1979 IEEE.

High–voltage current transformers with optical signal transmission Malewski Optical Engineering/Jan./Feb. 1981/vol. 20 No.1.

The use of fiber optics for communications, measurement and control, within high voltage substations Erickson IEEE Transactions on Power and Systems vol. PAS–99, No. 3 May/Jun. 1980.

Rogowski Coils Suits Relay Protection and Measurement Kojovic IEEE Computer Application in Power Jul. 1997.

Optical and Optoelectronic Switching Jokerst CLEO'95/ Tuesday Morning.

Circuit effect in $LiNbO_3$ 3 channel–waveguide modulators Becker Aug. 1985/ vol. 10 No. 8/Optics Letters.

*Primary Examiner*—Kamand Cuneo
*Assistant Examiner*—Jermele Hollington
(74) *Attorney, Agent, or Firm*—C. A Rowley

(57) ABSTRACT

A method and/or apparatus for measuring current in a high voltage (HV) current carrier generates a low voltage signal proportional to the current in the HV carrier and applies this signal to an integrated-optic voltage sensor located in the HV environment adjacent to the HV current carrier to produce a modulated optical signal representative of the current being measured. The optical signal from the integrated-optic voltage sensor is conducted to a low voltage (LV) environment insulated from said HV environment and processed to provide a second electrical signal. One of the electrical signals is integrated so that an output signal of the required accuracy is available form the system.

44 Claims, 10 Drawing Sheets

OPTICAL CURRENT MEASURING FOR HIGH VOLTAGE SYSTEMS

FIELD OF THE INVENTION

The present invention relates to a device for measuring current in high voltage (HV) power systems.

BACKGROUND OF THE PRESENT INVENTION

The concept of the hybrid current transformer with various means of sensing the current and various means of making the electrical to optical conversion is known. The motivation for using optics based measurement and/or signal transmission in HV power systems is that optical signals may be transmitted by inherently insulating means such as optical fibers. The hybrid current transformer combines traditional current sensing methods, including inductive or resistive current sensing, with optical signal transmission. The known current sensing means will be discussed first, followed by optical modulation methods.

CURRENT SENSING

The most direct method of sensing a current is to use a shunt resistor, having low resistance, in line with the sensed current. A voltage will be generated across the resistor proportional to the current through the resistor and the resistance. This method has the advantage over the Rogowski coil (discussed below) in that it does not require time integration, and it can measure DC current in addition to AC current. An example of the shunt resistor method is shown in U.S. Pat. No. 4,629,979. When used for HV applications, this example uses active electronics in the HV environment to transmit an analog or digital optical signal from the HV to low voltage (LV) environments. In the analog case, the optical signal is generated by applying a frequency modulated carrier signal to a light emitting diode.

U.S. Pat. No. 4,070,572 uses a shunt in combination with active circuitry to amplitude modulate an LED light source to transmit the measured current signal from HV to LV. This system uses active components in the HV environment and also places the light source in the HV environment.

U.S. Pat. No. 5,446,372 (also U.S. Pat. No. 5,420,504) primarily involves the physical design of a shunt, but does include the possibility of "electro-optically transmitting" the measured signal using an "electro-optical interface." The electro-optical interface is not described in detail but the measured signal is digitized prior to transmission.

The most common current sensing means in AC power systems is the inductive current sensor comprising a coil, which is inductively coupled with the sensed current. Within this broad class, there are two sub-classes: 1) devices which produce a secondary current which is proportional to the sensed or primary current, 2) devices which produce a voltage which is proportional to the time derivative of the sensed current. In general, the burden or load resistance placed on a coil will determine which of the two sub-classes apply. Specifically, when the inductive reactance of the coil is larger than the combined resistance of the coil and the burden, then the device will behave according to sub-class 1.

The conventional current transformer used in the power utility industry belongs to sub-class 1. These devices have no intrinsic voltage output, which makes them somewhat less appropriate for driving optical voltage sensors. A coil with sufficiently large inductance can however generate a voltage signal by placing a small resistance across the coil terminal and still behave according to sub-class 1. In this case, the voltage will be proportional to the secondary current and hence also proportional to the primary current. This method of current to voltage conversion is utilized as described by C. McGarrity, et al., AA fiber-optic system for three-phase current sensing using a hybrid sensing technique, @ *Review of Scientific Instruments*, Vol. 63, No. 3, pp 2035–2039, 1992, to drive an optical modulator. McGarrity's system is passive, using a current transformer and load resistor to generate a voltage signal which is applied to an interferometer.

A disadvantage of sub-class 1 devices is that they invariably use high permeability materials in the core of the coil. In addition to making the coil heavy, high-permeability materials are generally non-linear and can saturate when measuring large fault currents.

Devices, which fit sub-class 2, are generally referred to as Rogowski coils although other names are sometimes used such as linear coupler. Occasionally, Rogowski coils are classed as current transformers although, strictly speaking, they are a time-derivative of current to voltage transformer. They will operate in this manner even with an infinite load resistance, thus producing no current at all. A load resistor is usually used and can be sized to optimize the transient response of the coil, (see D. A. Ward, J. La T. Exon, "Using Rogowski coils for transient current measurement," *Engineering Science and Education Journal*, June 1993, pp. 105–113) or to compensate for the thermal expansion of the core (see G. Carlson, F. Fisher, "Voltage and current sensors for a 1200 kV gas insulated bus," $7^{th}$ *IEEE/PES Transmission and Distribution Conference and Exposition*, Apr. 1–6, 1979, pp. 200–207).

In order to measure current, sub-class 2 devices must be used in combination with an integrator to recover the sensed current signal from the time-derivative. Two analogue integrator types can be used: passive or active although the passive integrator is usually only used at higher frequencies (much higher than 50 or 60 Hz power frequencies) (see D. A. Ward.) The difficulty encountered in making a passive integrator that operates at low frequencies is that as the integrator time constant is made larger, the voltage output from the integrator decreases. This can be compensated for to some extent by increasing the Rogowski coil's output voltage (by increasing its mutual inductance) but at the expense of stressing the voltage withstand ability of the coil's winding insulation.

For example using a single pole passive integrator for high-accuracy metering applications having a phase accuracy at 60 Hz of 5 minutes of arc, the integrator pole location should be about 1000 times lower in frequency, or at 60 mHz. The voltage signal from the Rogowski coil will be 1000 times larger than the voltage signal from the integrator i.e. to obtain a 1 V integrator signal, the Rogowski voltage will be 1000 V at 60 Hz. If a bandwidth of 6 kHz is desired, an additional factor of 100 in Rogowski coil voltage must be tolerated, pushing its voltage level to 100 kV. This number will further increase by the over-current factor that is desired. A Rogowski coil and integrator capable of such high voltage levels is not cost justifiable.

A third type of integrator can also be used by digitally sampling the time-derivative signal and subsequently digitally integrating it.

The location of the integrator is also important. If the integrator is located in the LV environment, then the time-derivative signal must be transmitted from the HV to the LV environment. This places large demands on the transmitting means in terms of dynamic range. Either active integration or digital integration can be used in this case, but both pose problems due to amplification of low frequency signal corruption introduced by the optical system.

Low frequency signal corruption can be filtered out for revenue metering applications and as such, integration in the LV environment is appropriate for metering applications.

An alternative to locating the integrator in the LV environment is to place it in the HV environment. Powering a digital or active integrator in the HV environment is not a trivial task. Several powering methods which tap power from the HV line have been used including using an auxiliary current transformer, capacitive dividers, and resistive dividers (see R. Malewski, A High-voltage current transformers with optical signal transmission,@ *Optical Engineering*, Vol. 20, No. 1, 1981, pp. 54–57.) All of these methods represent a finite turn-on time when energizing a line which can be a hazard when energizing a faulted line. Batteries may be used to get around this problem but with the added problem of maintaining them. Power can also be supplied independently to the integrator by optical power transmission (see D. C. Erickson, "The use of fiber optics for communications, measurement and control within high voltage substations," *IEEE Transactions on Power Apparatus and Systems*, Vol. PAS-99, No. 3, 1980, pp. 1057–1063.)

Non-passive integrators located in the HV environment are not only difficult to power, but can also suffer from electromagnetic interference. This further complicates their power supply design as well as the required electromagnetic shielding. A further disadvantage of non-passive integrators located in the HV environment is that they are more prone to failure due to both their use of transistor circuits as compared to only using resistor/capacitor circuits, and having considerably more components as compared to a passive integrator.

Optical Modulators

The purpose of the optical modulator is to convert the electrical signal from the current sensor into an optical signal which can readily be transmitted from the HV environment to the LV environment. Methods of achieving this objective can be divided into two broad classes. 1) devices having active components in the HV environment, 2) devices having fully passive components in the HV environment.

Examples of class 1 include U.S. Pat. Nos. 4,070,572 and 4,471,355. U.S. Pat. No. 4,070,572 uses an LED that is intensity modulated by the sensed current signal. U.S. Pat. No. 4,471,355 uses a Rogowski coil (referred to as a "toroidal coil") in combination with a transmitter located in the HV environment to send pulses encoded with amplitude and phase information representing the sensed current signal. The system disclosed in U.S. Pat. No. 4,471,355 also includes an integrator in the HV environment which is believed to be an active integrator since they have a power-supply available which is also used for the transmitter. L. Kojovic, "Rogowski Coils Suit Relay Protection and Measurement," *IEEE Computer Applications in Power*, July 1997, pp. 47–52, illustrates a current measurement system combining a Rogowski coil with analog to digital conversion. The digitized signal is transmitted optically from the HV to LV environments.

Several passive optical modulation methods have been developed for hybrid current measurement.

U.S. Pat. No. 4,894,609 (expired) and 5,012,182 describe a porcelain insulator with an electro-optic modulator combined with a current transformer. The current transformer generates a voltage signal by passing its secondary current through a load resistance. The voltage signal is then applied to a bulk Pockels cell. Two disadvantages of this sensor are 1) it has low sensitivity due to the bulk crystal used and the associated large electrode separation, 2) the sensor provides only a single optical signal and therefore the optical signal cannot be normalized in the manner that a dual channel Pockels cell can. Although dual channel bulk Pockels cells are well known, this increases the complexity of the optical components located in the HV environment. This is disadvantageous because components in the HV environment must endure harsh environmental conditions and as such are more prone to failure and also the temperature stability of the optical components can affect measurement accuracy.

U.S. Pat. No. 4,376,247 describes a remote current sensor using a liquid crystal attenuator to modulate light intensity. The current signal is obtained by use of a current transformer. U.S. Pat. No. 3,662,263 describes a method of obtaining optical modulation for the purpose of encoding a sensed current signal by phase modulating one of two coherent optical paths and subsequently combining the paths to obtain an optical intensity modulation.

The McGarrity reference referred to above describes a method of obtaining optical modulation for the purpose of encoding a sensed current signal using a fiber optic Michelson interferometer. A PZT stretcher modulates one of the path lengths in the interferometer.

U.S. Pat. No. 5,103,164 issued Apr. 7, 1992 to Kawaguchi et al. describes one such method in which a Faraday sensor is enclosed in a solenoid, and the solenoid is connected to a Rogowski coil. The solenoid produces a magnetic field proportional to the sensed current. The Faraday sensor then senses this magnetic field and produces an optical modulation. U.S. Pat. No. 5,103,164 also discusses the application of the Rogowski coil signal to a load resistor and a Pockels element. The type of Pockels element is not specified explicitly but the signal levels given in the preferred embodiment are representative of a bulk-optic Pockels cell and are considerably larger than the signal levels preferred for the present invention. Kawaguchi's invention, with the Pockels element embodiment, does not provide a means to integrate the time derivative signal generated by the Rogowski coil.

An overview of optical current sensors can be found in: Emerging Technologies Working Group, Fiber Optic Sensors Working Group, "Optical Current Transducers for Power Systems: A Review," *IEEE Transactions on Power Delivery*, Vol. 9, No. 4, 1994, pp. 1778–1788.

U.S. Pat. No. 5,029,273 describes the integrated-optic Pockels cell (IOPC) and is discussed hereinbelow.

BRIEF DESCRIPTION OF THE PRESENT INVENTION

It is an object of the present invention to provide a hybrid optical current sensor for measuring current in a high voltage current carrier.

It is also an object of the present invention is to provide a system capable of measuring current in HV power systems with sufficient accuracy and dynamic range for power metering.

It is also an object of the present invention to provide system with a frequency response and dynamic range sufficient for protective relaying.

Broadly the present invention relates to a method and/or apparatus for measuring current in a HV current carrier comprising a current to voltage transducer for generating a low voltage signal representative of said current in said HV carrier, applying said low voltage signal to an integrated-optic voltage sensor, said current to voltage transducer and said integrated-optic voltage sensor located in a HV environment adjacent to said HV current carrier to produce a modulated optical signal representative of said current being measured and conducting said optical signal to a LV environment insulated from said HV environment, processing said optical signal to provide a second electrical signal representative of said current.

In a preferred embodiment, said current to voltage transducer is a shunt resistor, and said low voltage signal and said second electrical signal are substantially proportional to said current.

In another preferred embodiment, said current to voltage transducer is a current transformer with a load resistor, and said low voltage signal and said second electrical signal are substantially proportional to said current.

In another preferred embodiment, said current to voltage transducer is a Rogowski coil, and both said low voltage signal and said second electrical signal are substantially proportional to the time derivative of said current.

In another preferred embodiment, said current to voltage transducer is a Rogowski coil, said low voltage signal is substantially proportional to the time derivative of said current, and said second electrical signal is integrated in the LV environment to provide a third electrical signal substantially proportional to said current.

In another preferred embodiment, said current to voltage transducer is a Rogowski coil, said low voltage signal, which is substantially proportional to the time derivative of said current, is passively integrated to provide a modulating signal that is applied to said integrated-optic voltage sensor, and said modulating signal and said second electrical signal are substantially proportional to said current.

In another preferred embodiment, said current to voltage transducer is a Rogowski coil, said low voltage signal is passively integrated by a first integrator over at least one portion of said apparatus' bandwidth to provide a modulating signal which is representative of said current, and said second electrical signal is integrated in the LV environment by a second integrator over those at least one portions of said bandwidth that have not been integrated by said first integrator, to provide said third electrical signal which is substantially proportional to said current.

Preferably all components located in the HV environment are passive.

Preferably said current to voltage transducer consumes little power, is light in weight, and does not generate substantial heat.

Preferably said low voltage signal is conditioned before application to said integrated-optic voltage sensor.

Preferably said integrated-optic voltage sensor's bias is used to compensate for thermal variation of components located in the HV environment.

Preferably said integrated-optic voltage sensor is an IOPC.

Preferably said IOPC has at least two electrodes.

Preferably said at least two electrodes are located on the surface of an IOPC substrate on which a waveguide is formed.

Preferably two electrodes are located on said surface, said waveguide is located between said two electrodes, said substrate is X-cut lithium niobate, and said waveguide is directed along the crystallographic Z direction.

BRIEF DESCRIPTION OF THE DRAWINGS

Further features, objects and advantages will be evident from the following detailed description of the preferred embodiments of the present invention taken in conjunction with the accompanying drawings in which.

DETAILED DESCRIPTION

Figures 1A, 1B:
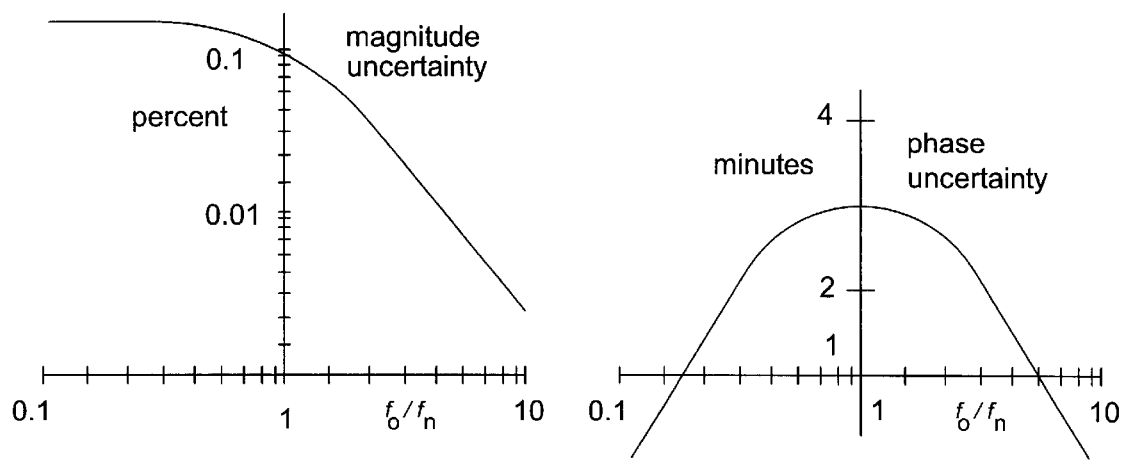
FIGS. 1A and 1B respectively show the resulting magnitude and phase uncertainty caused by a single pole integrator for an uncertainty of $\forall 0.175\%$ in the integrator's pole frequency, $f_0$, as a function of $f_0$ normalized by the nominal frequency $f_n$.

The term integrator as used herein is intended to define a circuit or algorithm which substantially integrates a signal over at least one range of frequency. The terms high voltage (HV) environment and low voltage (LV) environment as used herein are intended to define two regions of space that can have substantial difference in electrical potential. In typical applications the LV environment will have substantially the same electrical potential as the ground, and the HV environment will have substantial electrical potential with respect to ground. In other applications, both the HV environment and LV environment may have substantial electrical potential with respect to ground and to each other. In all cases, the LV environment includes the region of space to which the output signal of the current sensor is delivered.

The two primary reasons for measuring current in HV power systems are for revenue metering and for protective relaying. The former typically requiring high accuracy and large dynamic range during steady state conditions, the latter typically requiring large dynamic range and adequate transient performance. Both of these applications are targeted by this invention.

Before describing the present invention it should be mentioned that the dynamic range for power metering typically covers a span from 5% or 10% to 120% rated current. The dynamic range for protective relaying mainly satisfies the need to measure over-currents typically from 5 to 40 times rated current.

Revenue metering of current requires high accuracy over a wide range of current levels. Typical high accuracy metering requirements are on the order of 0.3% at rated current and 0.6% at 10% of rated current.

The hybrid current transformer of the present invention combines a current to voltage transducer with an integrated-optic voltage sensor. The integrated-optic voltage sensor allows the signal from the current to voltage transducer to be transmitted from a HV environment to a LV environment by an optically isolated means. In a preferred embodiment, the current is sensed by a Rogowski coil that generates a voltage signal proportional to the time derivative of the primary current (TDPC) which is encircled by the coil. Because of the time derivative, the range of voltage levels in the voltage signal is proportional to the range of current levels being sensed, multiplied by the range of frequencies being measured. The optical modulator receives light by optical fiber from an optical source located in the LV environment. The modulated light is then led from the HV environment to the LV environment by optical fiber to an optical-to-electrical converter. Integration of the TDPC signal to recover the current signal may be performed in either the HV environment, prior to the integrated-optic voltage sensor, in the LV environment after the optical-to-electrical conversion, or in both HV and LV environments.

The Combination

The combinations of the various elements to provide the present invention and descriptions of some of the circuits will now be presented with reference to FIGS. 4 through 12.

Figure 4:
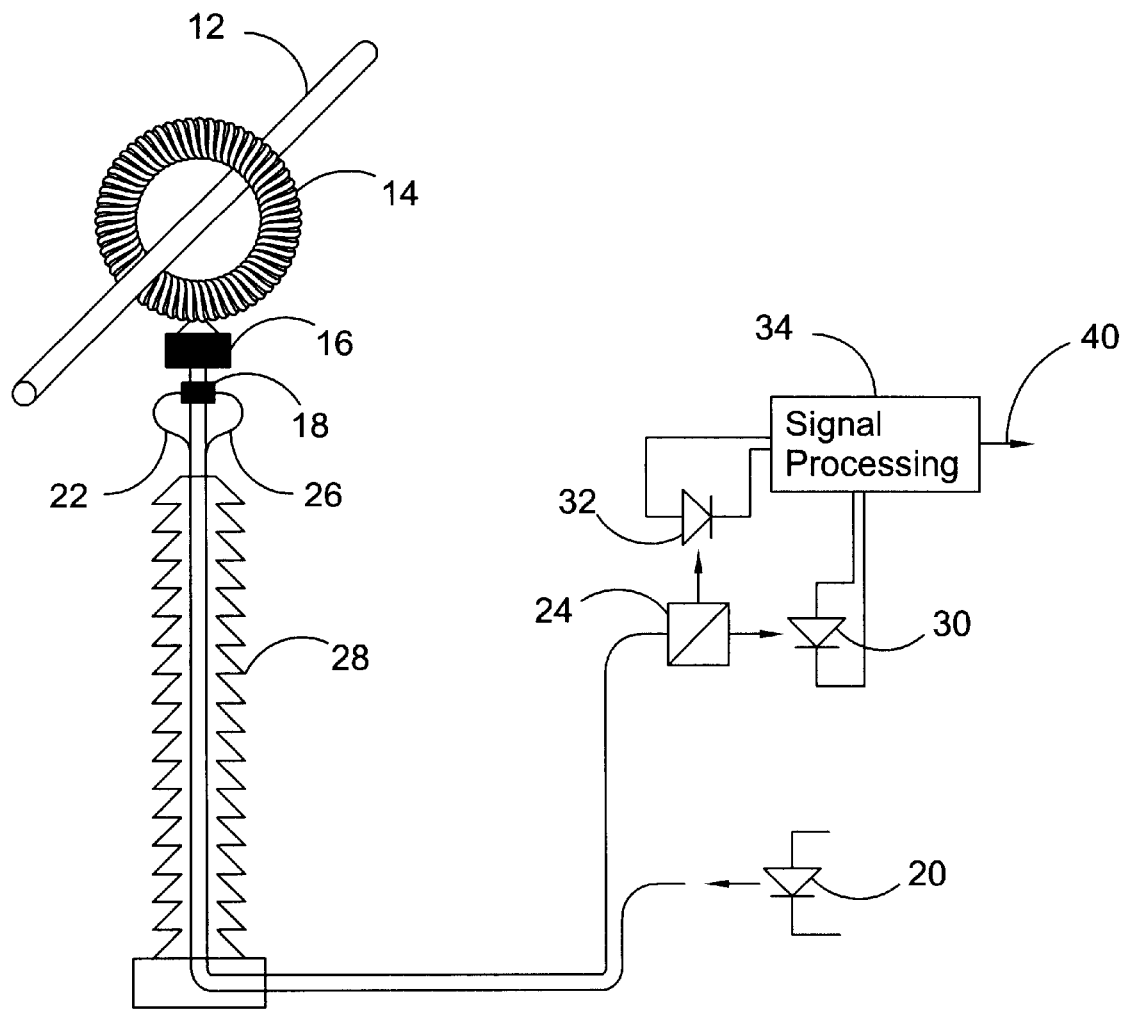
FIG. 4 is a system schematic illustrating the application of the present invention.

As shown in FIG. 4 the basic concept of the present invention is illustrated with the integrator in the HV environment. The system measures the current in the high voltage line or bus 12. The system includes a current to voltage transducer in the form of a Rogowski coil 14 in surrounding relation to the line 12 to generate a voltage that is proportional to the time derivative of the current in the line 12. The output voltage from the Rogowski coil 14 is integrated in an integrator 16 and then applied to an integrated-optic voltage sensor in the form of an IOPC 18. Light is delivered to the IOPC 18 from the optical source 20 via a polarizing fiber 22 and is delivered from the IOPC 18 to a polarizing beam splitter 24 via a polarization-maintaining fiber 26. The fibers 22 and 26 pass from the HV environment adjacent to the HV line 12 to the LV environment adjacent to the light source 20 and splitter 24 via an insulating column 28. The light from the splitter 24 is detected by a pair of photodetectors 30 and 32 and delivered to the data acquisition and processing unit 34 having a signal output, generally indicated by numeral 40 in FIGS. 4–8, for outputting a signal representative of the current intended to be measured.

Figure 5:
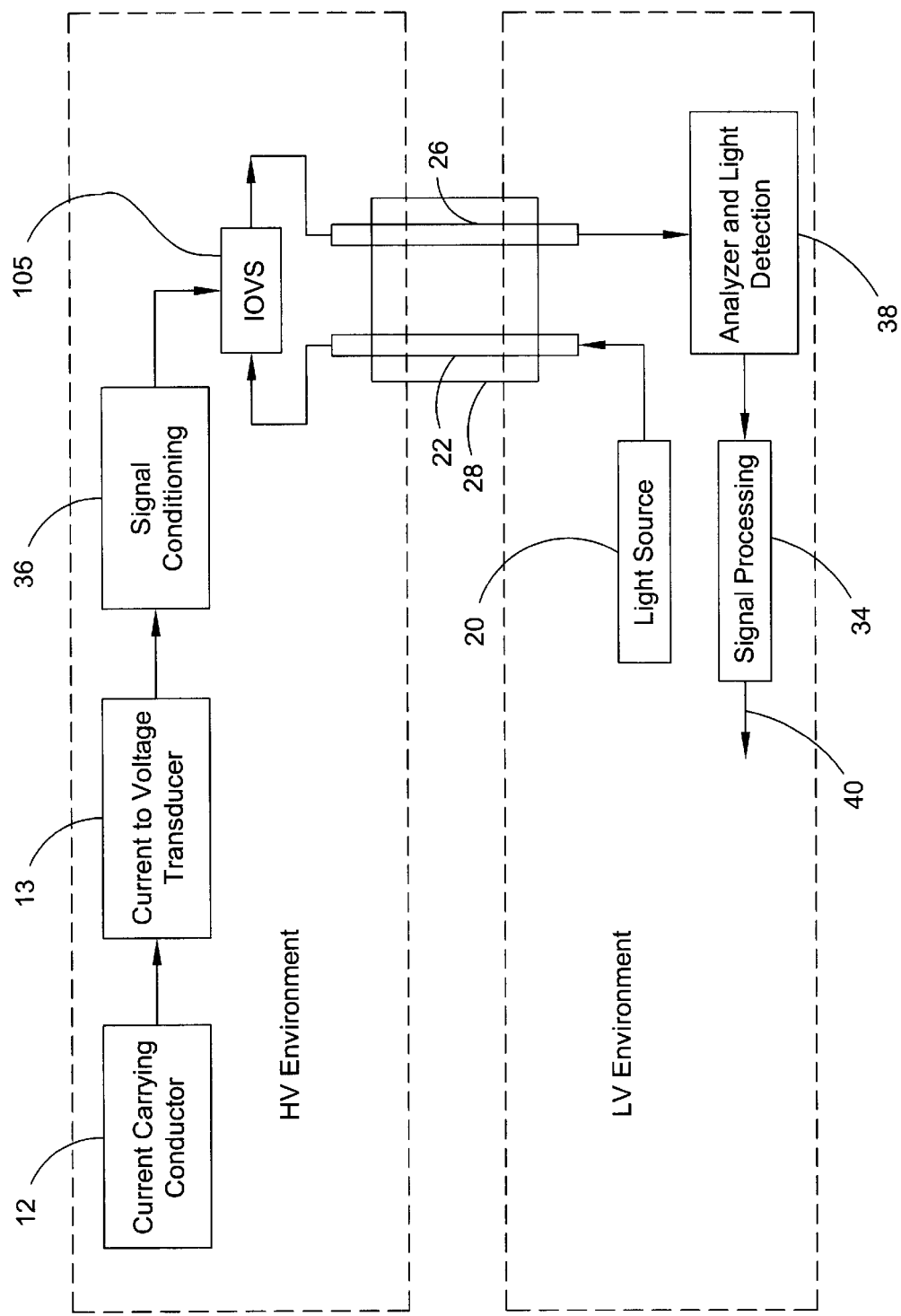
FIG. 5 is a schematic diagram illustrating the broad concept of the invention.

In FIG. 5 the steps of the basic concept of operating the system are illustrated (the various components have the same reference numerals as used in describing the system in FIG. 4). The system illustrated in FIG. 5 differs from that of FIG. 4 in that the integrated-optic voltage sensor (IOVS) 105 is broadly illustrated in place the IOPC 18. The system illustrated in FIG. 5 further differs from that of FIG. 4 in that the voltage transducer 13 is broadly illustrated to include any suitable voltage transducer 13 (such as the Rogowski coil 14 shown in FIGS. 4, 6, 7, and 8, the shunt shown in FIG. 11, and the current transformer shown in FIG. 12) and a signal conditioner 36 is interposed between the voltage transducer 13 and the IOVS 105. Also in the illustrated arrangement, the analyzer and light detection unit 38 are shown in place of the splitter 24 and photodetectors 30 and 32.

Figure 6:
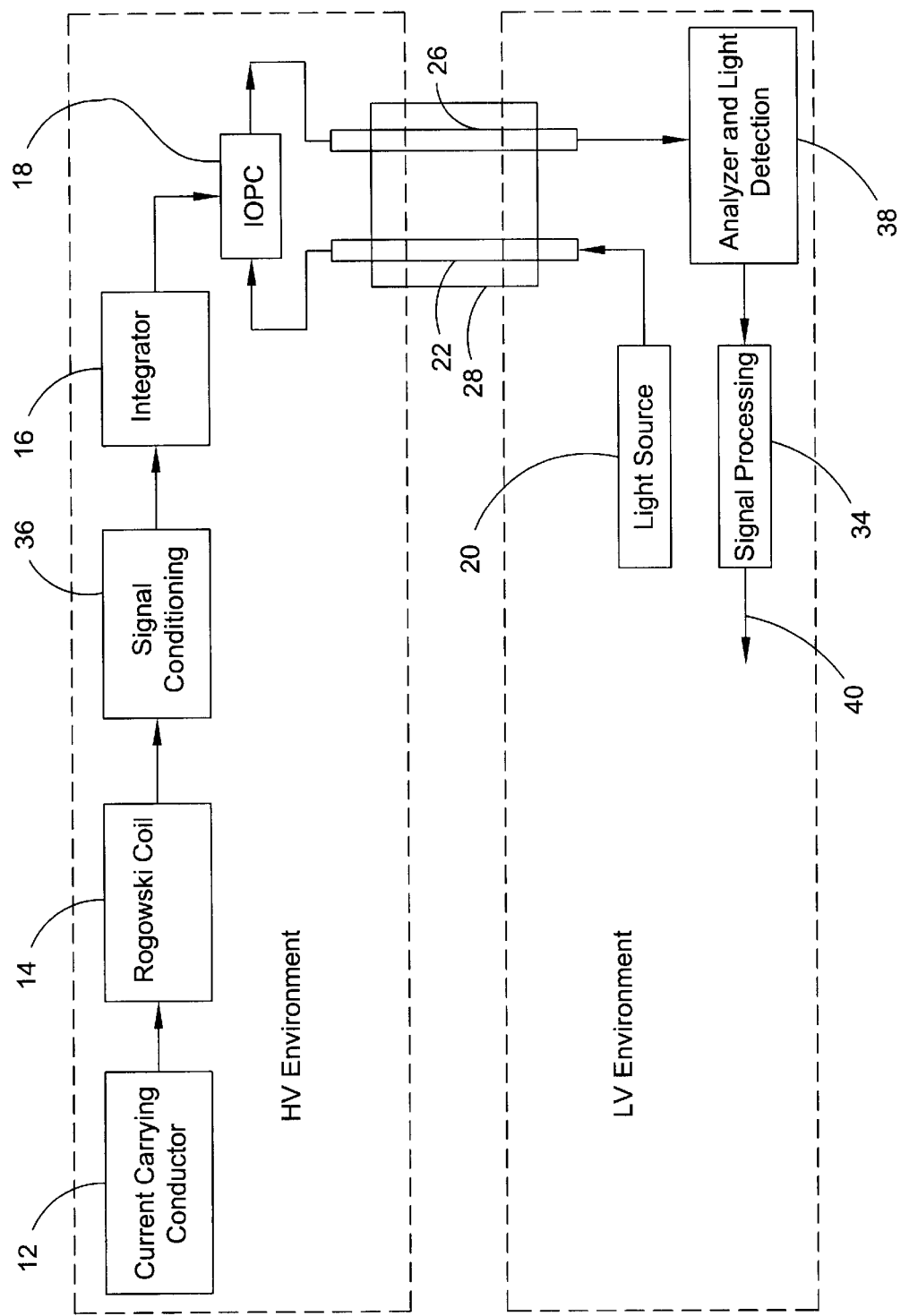
FIG. 6 is a schematic diagram showing a Rogowski coil with an integrator in the HV environment.

Turning to FIG. 6 the system illustrated in this figure differs from that of FIG. 5 by replacing the broadly defined voltage transducer 13 with a preferred form of the transducer namely a Rogowski coil 14 and with the integrator 16 in the HV environment. The system illustrated in FIG. 6 also differs from that of FIG. 4 in that a signal conditioner 36 is interposed between the Rogowski coil 14 and the integrator 16, and the analyzer and light detection unit 38 is shown in place of the splitter 24 and photodetectors 30 and 32. The method of FIG. 6 comprises using magnetic induction in the Rogowski coil 14 to generate a low voltage signal that is then conditioned in signal conditioner 36 to provide a signal of selected maximum amplitude and this signal is then integrated in the integrator 16 to provide a modulating signal that is substantially proportional to the sensed current in line 12. The modulating signal is applied to the IOPC 18. Light enters the fiber 22 and is linearly polarized before it enters the IOPC 18, where it is modulated and leaves as light having modulated polarization. The polarization maintaining fiber 26 interrogates the polarization state of light leaving the IOPC 18 to obtain a differential amplitude modulation of the fast and slow modes of the polarization maintaining fiber 26. The differential amplitude modulation is maintained in fiber 26 as it is directed to the analyzer and light detection unit 38 to provide a pair of useable signals that are interpreted in the signal processing unit 34 to output a signal (second low voltage signal) representing the sensed current as is generally indicated by signal output 40.

It should be noted that other methods of delivering and receiving light to and from the IOPC may be used and will be realizable by one skilled in the art. For example linearly polarized light may be delivered to the IOPC by replacing polarizing fiber 22 by a standard single-mode fiber in combination with a thin film polarizer interposed between the IOPC 18 and said standard single mode fiber. A further method to deliver linearly polarized light to the IOPC 18 is to replace polarizing fiber 22 by a polarization maintaining fiber and by either choosing an optical source 20 to emit polarized light or by interposing a polarizing element between the optical source 20 and the polarization maintaining fiber which replaces the polarizing fiber 22. In addition to the method described above, light which exits the IOPC 18 may be interrogated by replacing the polarization maintaining fiber 26 with a polarizing fiber, or, by replacing the polarization maintaining fiber 26 with single- or multi-mode fiber and interposing a thin film polarizer between the IOPC 18 and said single- or multi-mode fiber. These last two methods are not preferred as they will yield only one intensity modulated optical signal.

Figure 7:
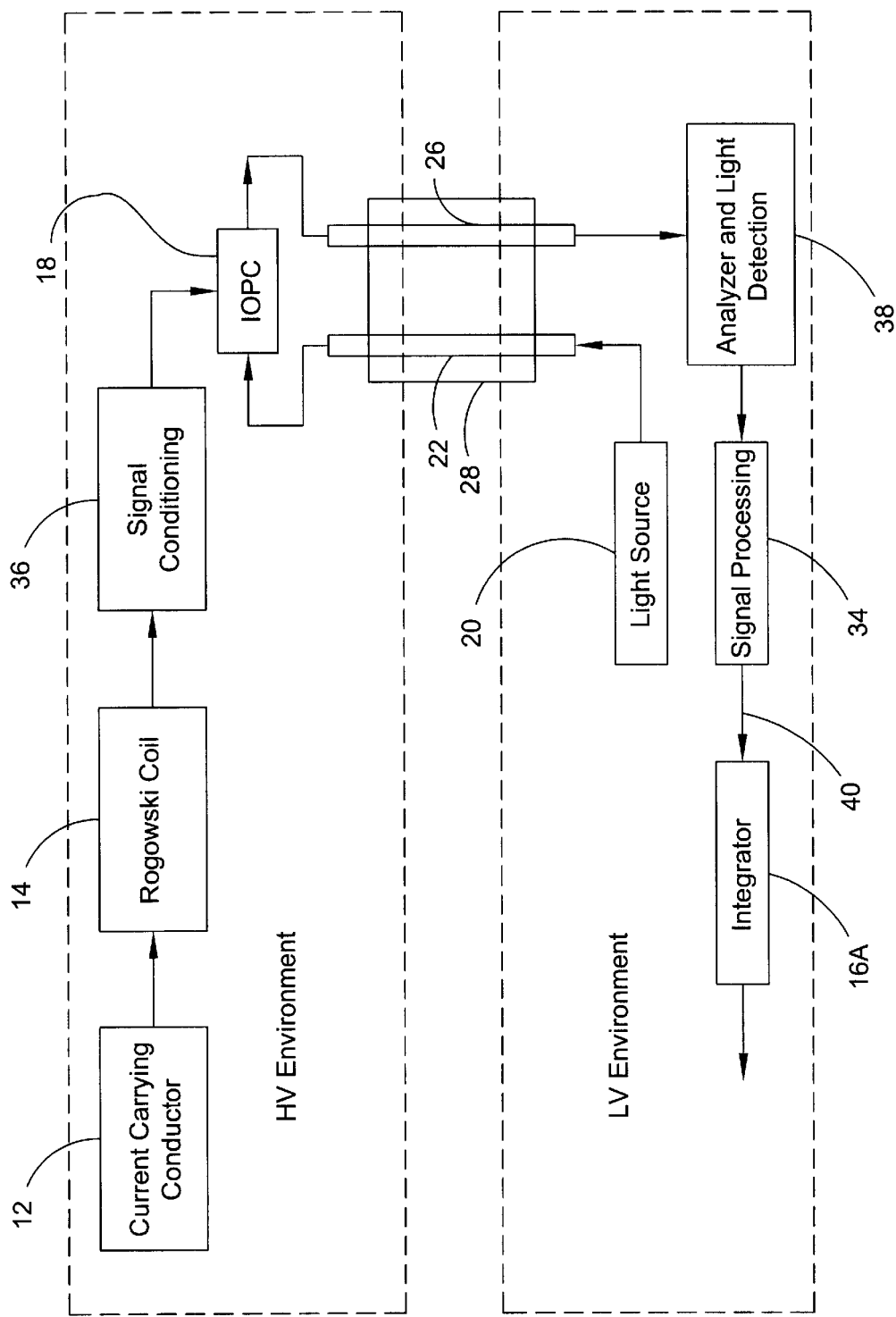
FIG. 7 is a schematic diagram showing a Rogowski coil with an integrator in the LV environment.

The system illustrated in FIG. 7 is essentially the same as FIG. 6 except that the integrator 16 which was in the HV environment has been replaced with an integrator 16A that is located in located in the LV environment. The operation of the FIG. 7 embodiment is the same as FIG. 5 except that the voltage from the signal conditioner 36 is applied directly to the IOPC 18 and the processed signal is integrated as indicated at 16A to provide the signal representative of the current in the line 12.

Figure 8:
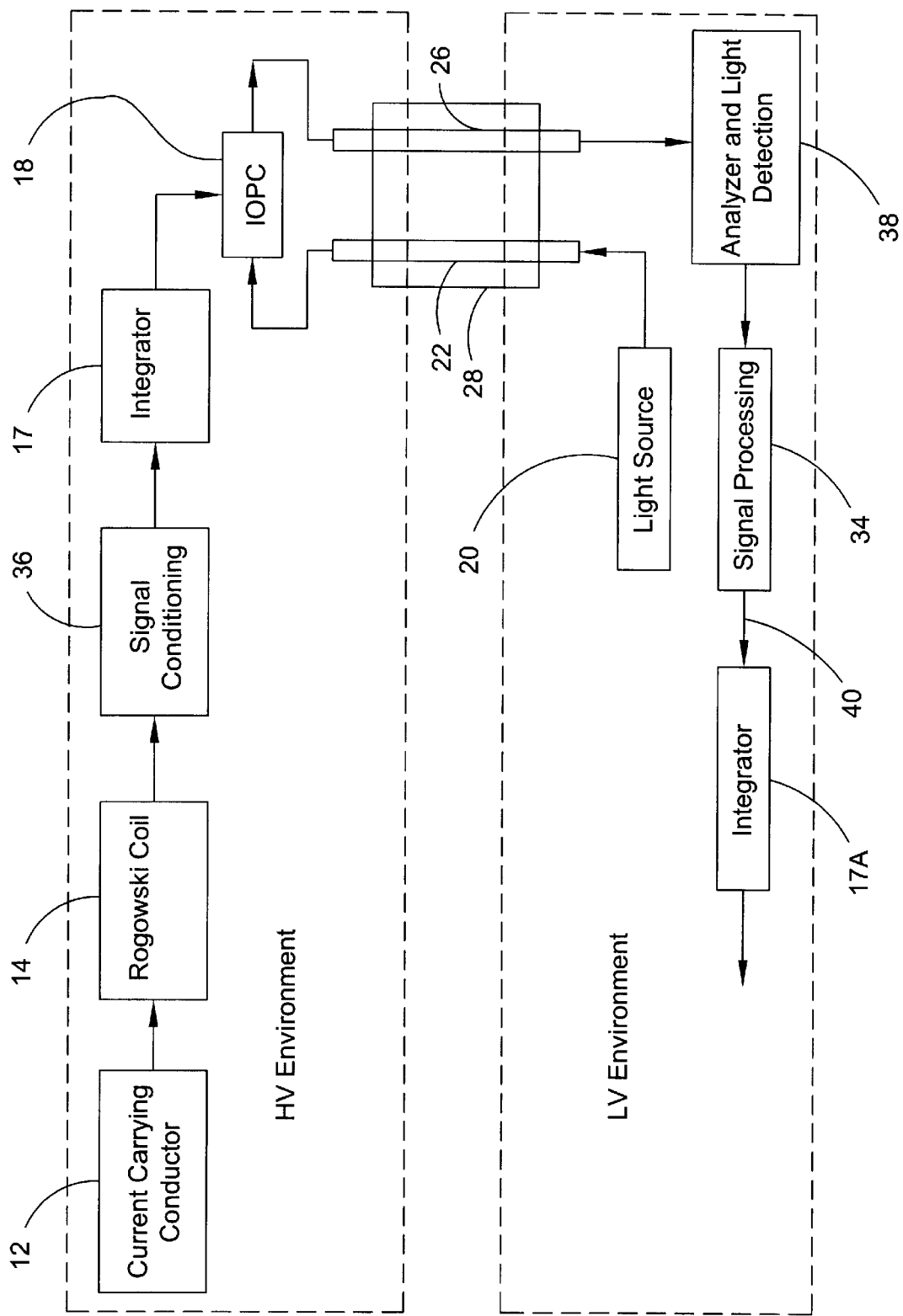
FIG. 8 is a schematic diagram showing a Rogowski coil with an integrator in the HV environment and a second integrator in the LV environment.

The system in FIG. 8 is essentially the same as FIG. 6 except that the integrator 16 as been replaced by a first integrator 17 which integrates over at least one portion of the system's bandwidth to provide a modulating signal that is applied to the IOPC 18. A second integrator 17A is introduced to integrate the output of the signal processing unit 34 over those at least one portions of the system's bandwidth not integrated by the first integrator 17. The combination of integrators 17 and 17A thus provide integration over the entire bandwidth of the system. The second integrator 17A, in addition to its function of partially undoing the differentiation of the Rogowski coil 14, may also be designed to attenuate noise introduced by the system components 20, 22, 18, 24, 38, 34 at frequencies above the nominal power frequency.

It should be noted that in some instances it may be desirable for the signal processing unit 34 and/or the integrators 16A and 17A to have a plurality of outputs. For example, the system illustrated in FIGS. 7 and 8 could have increased functionality by replacing integrator 16A (FIG. 7) or integrator 17A (FIG. 8) with a plurality of integrators having characteristics appropriate for various applications. For example, both a low-noise narrow band-width output and a high-noise wide band-width output could be provided.

Figure 9:
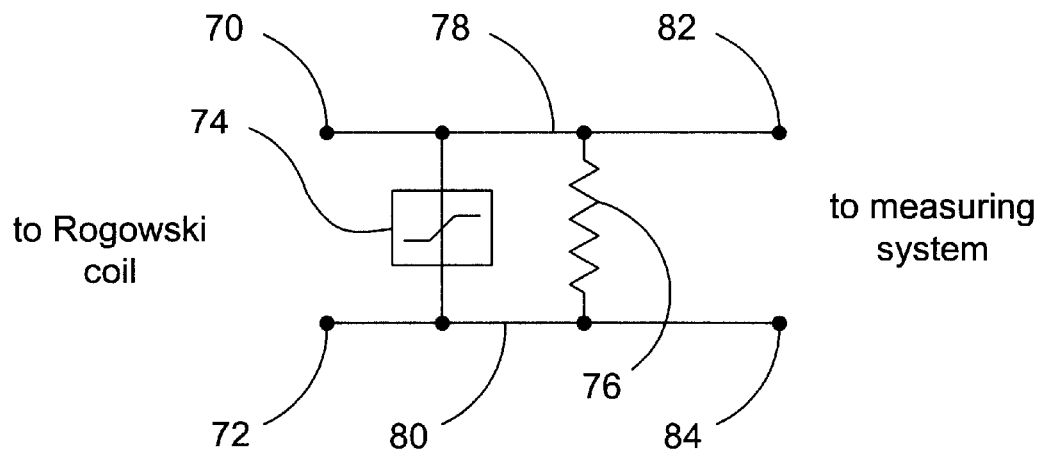
FIG. 9 is a schematic of a typical signal conditioning circuit.

FIG. 9 is a schematic of a typical signal conditioner 36 for use in the present invention. The illustrated conditioner 36 has its contacts 70 and 72 receiving input from the Rogowski coil and comprises a surge suppressor 74 and a load resistor 76 shunted across the lines 78 and 80 that are connected at terminals 82 and 84 to the measuring system (integrator 16 in FIG. 6 or IOPC 18 in FIG. 7 or the integrator 17 in FIG. 8).

Figure 11:
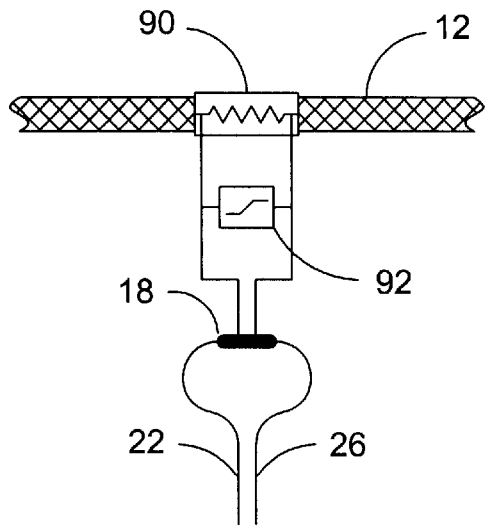
FIG. 11 shows a shunt circuit that may be used to generate a low voltage signal proportional to a large current and applying the low voltage signal to an IOPC.

FIG. 11 shows an alternative system for obtaining a low voltage signal proportional to the current in the HV line 12. In this system the Rogowski coil has been replaced by an appropriately sized shunt resistor 90. The shunt resistor 90 in the illustrated arrangement is connected to the IOPC which is connected as above described to the source of light and the analyzer. The signal conditioning here is provided by a surge suppresser 92; the resistor 76 from FIG. 9 is not included since it does not contribute any functionality in this arrangement. It should be noted that surge suppression techniques generally consist of more than one element and it is not the objective to limit the possibilities to what is shown in FIG. 11. Any surge suppressing circuit can be interposed between the IOPC and the current to voltage transducer provided it does not alter the phase or magnitude of the signal applied to the IOPC significantly.

Figure 12:
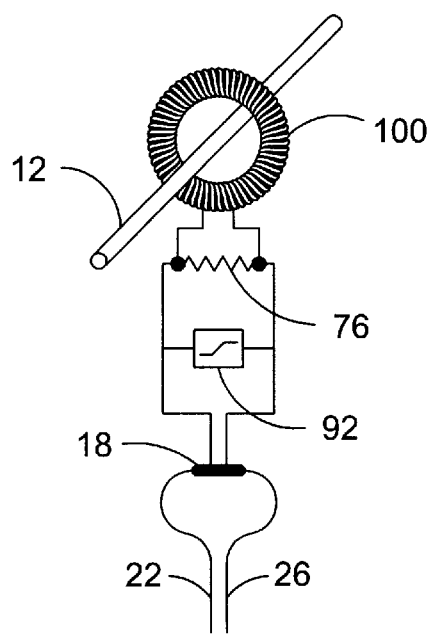
FIG. 12 shows a current transformer in combination with a load resistor that may be used to generate a low voltage signal proportional to a large current and applying the low voltage signal to an IOPC.

FIG. 12 shows an alternative system for obtaining a low voltage signal proportional to the current in the HV line 12. In this system the Rogowski coil has been replaced by a current transformer 100. The current transformer 100 in the illustrated arrangement is connected to a load resistor 76 which generates a low level voltage signal proportional to the current in the current transformer 100, which in turn is proportional to the current in the HV line 12. The low level voltage signal across the load resistor 76 is applied to the IOPC 18 which is connected as above described to the source of light and the analyzer. A surge suppresser 92 protects the IOPC 18 from electrical break down. It should be noted that surge suppression techniques generally consist of more than one element and it is not the objective to limit the possibilities to what is shown in FIG. 12. Any surge suppressing circuit can be interposed between the IOPC and the current to voltage transducer provided it does not alter the phase or magnitude of the signal applied to the IOPC significantly.

Component parts of the present invention will now be described

Integrated-optic Pockels Cell Design

The integrated-optic Pockels cell (IOPC) is an optical modulator as described in U.S. Pat. No. 5,029,273. The transfer function, applied voltage $V_a$ to optical powers $P_1$ and $P_2$, of the IOPC may be written as:

$$P_{1,2} = \frac{P_0}{2}\left[1 \pm \gamma \sin\left(\frac{\pi V_a}{V_{pi}} + \phi\right)\right]$$

where $P_0$ is the total optical power, $\gamma$ is greater than zero and less than or equal to 1 and is related to the contrast ratio of the IOPC in combination with the light source 20, $V_{pi}$ is the half-wave voltage, and $\phi$ is the relative optical bias. Detection of the optical powers $P_1$ and $P_2$ by photodetectors 30 and 32 provide two electrical signals $S_1$ and $S_2$.

Figure 3A:
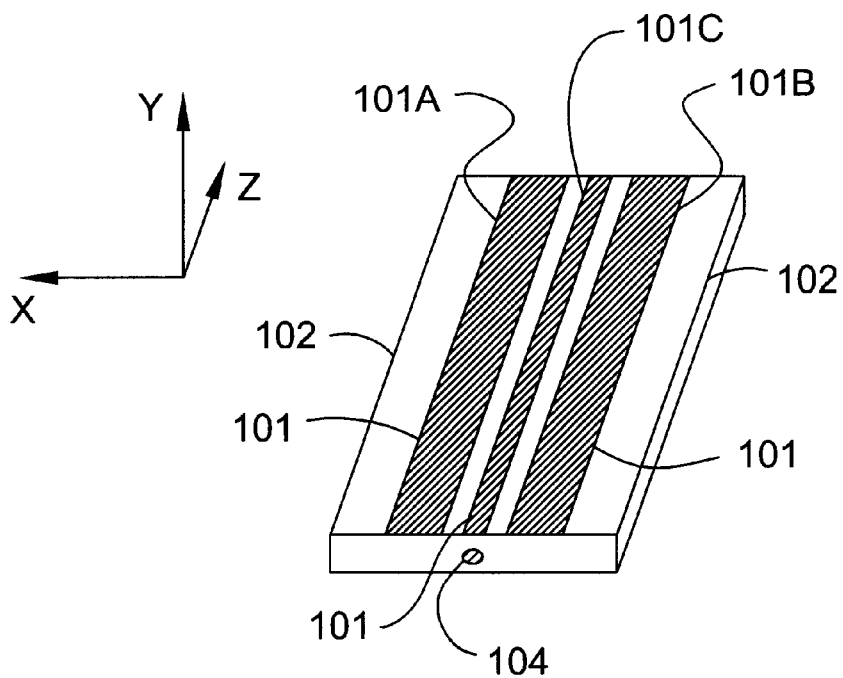
FIG. 3A shows a three electrode IOPC structure and the corresponding crystallographic axes for a lithium niobate substrate.
Figure 3B:
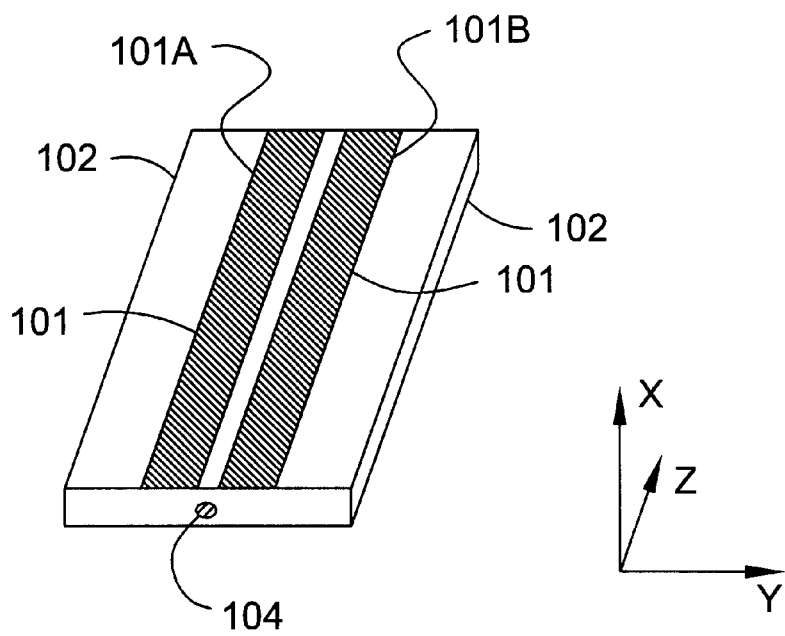
FIG. 3B shows a two electrode IOPC structure and the corresponding crystallographic axes for a lithium niobate substrate.

To reduce the half-wave voltage of the IOPC and hence reduce the required signal level of the current to voltage transducer, electrodes 101 are integrated onto the surface of the IOPC substrate 102 on which the waveguide 104 is formed. Two variations of the electrode structure are shown in FIG. 3A and 3B. In FIG. 3A a three electrode system is shown with the third or central electrode 101C position directly over the waveguide 104 and the electrodes 101A and 101B symmetrically located on opposite sides of the waveguide 104. The system shown in FIG. 3B is a two electrode system wherein the center electrode 101C is eliminated and only the two side electrodes 101A and 101B symmetrically positioned relative to the waveguide 104 are provided.

These structures are able to provide an IOPC with a half-wave voltage on the order of 10 V for an electrode gap dimension on the order of 10 microns, and electrode length on the order of 20 mm. This represents a substantial increase (one to two orders of magnitude) in sensitivity over that readily obtainable with bulk-optic modulators used in prior art for hybrid current sensors. In decreasing the voltage signal level generated by the current to voltage transducer, care has to be taken to ensure that the magnetic fields generated by the primary current do not directly influence the modulator by inducing a parasitic voltage on the circuit leading to the modulator. The IOPC with integrated electrodes, by virtue of its small area, scales down the influence of magnetic interference as its sensitivity is scaled up. This occurs because the enhanced sensitivity of the IOPC results from the narrow gap between the electrodes (on the order of 10 microns to 100 microns) as opposed to bulk modulators which would typically be in the millimeter to centimeter range. A narrow gap, results in a larger electric field in the crystal and hence enhanced sensitivity. But the narrow gap also means that there is less area enclosed by the electrodes and hence less pick up of magnetic interference.

Incorporating electrodes onto a common surface requires measures to prevent surface conduction problems. Surface conduction on lithium niobate modulators has been investigated for the telecommunications industry because it causes drift in the bias voltage applied to maintain the modulator at the desired operating point. This phenomenon is referred to as "DC drift" in the literature (see M. Minakata, T. Yonai, K. Yamada, "DC-drift-free Ti-diffused LiNbO$_3$ optical modulators," *CLEO'95*, paper CTuD1, 1995, pp. 62–63.) For passively biased sensor applications, the conduction mechanisms leading to DC drifts in actively biased modulators, manifest themselves as frequency dependent phase and magnitude changes. The result is an influence on the phase and magnitude accuracy of measured low frequency signals. This is particularly important for revenue metering in the power utility industry. While low frequency time constants associated with surface conduction can be compensated for by filtering circuits, doing so requires characterization and extra components leading to increased cost. A more limiting problem with using filtering circuits to compensate for surface conduction is that the conduction process is not expected to be constant with temperature change and the long term stability of the conduction process is unknown.

The preferred method of electroding the IOPC is to use a 2 conductor structure shown in FIG. 3B. With this design, no buffer layer is required and the electrodes are deposited on the surface of the lithium niobate. Such an electrode structure with no buffer layer was used by Becker who measured the step response of Mach-Zehnder modulators in lithium niobate (see R. A. Becker, "Circuit effect in $LiNbO_3$ channel-waveguide modulators," *Optics Letters*, V10, N8, 1985, pp. 417–419.) Becker obtained a time constant of 18 seconds and a drift amplitude of 0.5%. for a Z-propagating modulator. This performance is sufficient for high-phase and magnitude accuracy at typical power frequencies. To accommodate this electrode structure on the IOPC, the substrate is chosen to be X-cut and Z propagating.

An alternative electrode structure using Y-cut lithium niobate is shown in FIG. 3A. The 3-strip design can also be used with one of the outer electrodes removed but with the waveguide still located under an electrode. This structure typically uses a buffer layer to isolate the waveguide from the metallic electrode located above the waveguide. In the Minakata reference, an electrode structure having one electrode on top of each waveguide arm of a Mach-Zehnder modulator in lithium niobate is used in combination with a buffer layer. To obtain low drift, the buffer layer was removed from between the electrodes using a lift-off process to provide high resistivity between the electrodes. The authors claim to have obtained a "DC-drift-free" modulator but qualify their claim, indicating that some modulators showed small drifts. It is not clear what the time constants of these drifts are and correspondingly what their influence on power frequency measurement is. Thus the electrode structure of FIG. 3A may also be suitable for high-accuracy phase and amplitude measurement with the IOPC.

The optical bias of the IOPC is known to be a function of temperature (see N. A. F. Jaeger, F. Rahmatian, Aintegrated Electro-Optic High-Voltage Sensors,@ *Optical Sensors for Utility T&D Applications Workshop*, Jul. 20–21, 1995, Portland Oreg., 9 pages, also see FIG. 13.) Jaeger and Rahamatian describe the use of tracking the bias of integrated-optic voltage sensors to compensate for their temperature dependent parameters. For the present invention, bias tracking can be additionally used to compensate for temperature dependent parameters of the Rogowski coil 14 and integrator 16 in FIG. 4; the current-to-voltage transducer 13 in FIG. 5; the Rogowski coil 14 and integrator 16 in FIG. 6; the Rogowski coil 14 in FIG. 7; the Rogowski coil 14 and integrator 17 in FIG. 8; the load resistor 76 in FIG. 9; the components $R_1$, $R_2$, $R_3$, $C_1$, and $C_2$ of the passive integrator with phase compensation in FIG. 10; the shunt resistor 90 in FIG. 11; and, the current transformer 100 and load resistor 76 in FIG. 12.

Current to Voltage Transducers

Several advantages result when using a high-sensitivity optical modulator stemming from the fact that the transducer which generates the voltage signal representing the current signal need not produce as large a voltage signal as is required by bulk-optic modulators.

A transducer which has reduced output level in general reduces cost, reduces weight, increases bandwidth, and increases lifetime. Three different transducers will be described along with the benefits of using these transducers with an IOPC.

Resistive Shunt With IOPC

The shunt resistor produces a voltage proportional to the current passing though the resistor, thus no integrating of the voltage signal is required. The power dissipated by the shunt resistor is equal to the product of the current passing through it, and the voltage drop across the resistor. For measuring large currents, for example 1000 amps, a resistance of 1 milli-ohm will generate a voltage of 1 volt, and dissipate 1000 watts as heat. The heat generated not-only represents wasted power, but also increases the temperature of the resistor which can in general lead to variation of the resistance and hence measurement uncertainty. To minimize the heat generated, a smaller resistance should be used, which for the present example results in a signal voltage less than 1 volt. For measuring such small signals, either an active circuit is required to amplify the signal or encoded it in some form for transmission, or a highly sensitive passive modulator can be used: the IOPC. The IOPC can be made sufficiently sensitive to measure voltages in the order of a 100 mV as a nominal signal level which for the present example could use a 0.1 milli-ohm resistor, generating only 100 watts of heat at 1000 A. Lower power dissipation typically results in high-accuracy measurements and slower material aging.

Current Transformer With IOPC

The current transformer (CT) when used in combination with the IOPC performs a similar role as is used in the McGarrity reference. The secondary winding of the CT is located in the high voltage environment, unlike the conventional CT used for high voltage applications where the secondary is held at low voltage using considerable insulation from. the high voltage environment. An ideal CT generates a current in its secondary winding that is proportional to the primary current as well as the ratio of the number of windings on the primary to the secondary. A load resistor, or burden, is placed across the CT secondary winding to convert the secondary current into a voltage signal representing the primary current. The magnitude of the voltage signal will be dependent on the value of the load resistance; however, a large load resistance results in a larger voltage signal but at the expense of decreased CT performance. As the burden on the CT becomes large, the low frequency response of the CT suffers, resulting in a decreased bandwidth and consequently larger phase errors at the power frequency. This effect can be compensated for by increasing the reactance of the CT using a larger core, or a higher permeability core material but not without penalty. As the size of the CT becomes larger, the high frequency bandwidth decreases while the cost and weight increases. Furthermore, high permeability cores are more prone to saturation effects, which can greatly distort measurement of fault currents.

The resistance of the load resistor 76 will be many orders of magnitude smaller than is the case in the Rogowski coil implementation. For example, using a CT with a turns-ratio of 1000:1, to obtain a 200 mV voltage signal from a 2000 A primary current, the secondary current will be 2 A, and the load resistor must be 0.1 ohms. The accuracy of the sensor will be affected by the stability of the load resistor and as such the load resistor must of high quality and thermally stable.

1. Rogowski Coil With IOPC

The preferred method of obtaining a voltage signal representative of the primary current uses a Rogowski coil.

Rogowski coils are commercially available and their operation is well understood. The coil's core for use in the present invention should have a linear permeability and have a low thermal expansion coefficient. To compensate for the thermal expansion coefficient of the core, a load resistor can be used, the value of which is chosen by:

$$R_l = R_c \frac{(\alpha_{res} - \alpha_{rl} - \alpha_{lin})}{\alpha_{lin}}$$

where $R_l$ is the load resistance, $R_c$ is the coil resistance, $\alpha_{rl}$ is the temperature coefficient of the load resistor, $\alpha_{lin}$ is the effective linear expansion coefficient of the core material, and $\alpha_{res}$ is the temperature coefficient of resistivity of the coil.

A similar result is provided by the teaching of. G. Carlson, F. Fisher referred to above but their teaching ignored the temperature dependence of $R_l$.

The Rogowski coil generates a voltage V given by:

$$V = M \frac{dI}{dt}$$

where M is the mutual inductance between the Rogowski coil and the bus bar, I is the current through the bus bar, and t is time.

It is preferable for M and hence V to be small so that fast current surges (large dI/dt) will not cause electrical breakdown of the coil nor the circuitry connected to it. For this reason, the optical modulator should have a small half-wave voltage, characteristic of an integrated-optic modulator as opposed to a bulk-optic modulator. A surge limiting device should be used to protect the Rogowski coil and circuitry attached.

In a preferred embodiment a Rogowski coil is connected to a signal conditioning circuit, which in turn is connected to an IOPC. The mutual inductance of the Rogowski coil must be chosen along with the sensitivity of the IOPC to provide a compatible match which fits the target application. This arrangement, when used with a highly sensitive IOPC, e.g. a half-wave voltage of 20 V, can be used in combination with a low mutual inductance Rogowski coil to obtain a hybrid optical current sensor with high-accuracy and large bandwidth. In this embodiment, there are minimal components in the HV environment which reduces the possibility of measurement error due to component drift. The bandwidth of the current sensor is considerably enhanced over bulk-optic hybrid current sensors primarily for two reasons. First, the mutual inductance of the Rogowski coil can be reduced substantially (on the order of 10 to 100 times) from the value required to obtain a comparable optical modulation depth in a bulk-optic modulator. In reducing the Rogowski coil's mutual inductance, the resonant frequency of the Rogowski coil increases due to the resulting decreases in parasitic capacitance and self inductance associated with using fewer and/or smaller coil windings. Second, the bandwidth of the IOPC is considerably larger than that of a bulk-optic modulator because of the IOPC's small size and corresponding high resonance frequencies.

As an example, the D. Ward reference lists typical upper frequency limits for various Rogowski coil designs. The resonant frequencies listed range from 65 kHz to 2.8 MHz as the mutual inductance decreases. The text indicates that a typical coil having a mutual inductance of 0.2 $\mu$H has a resonant frequency in the order of 1 MHz. Coils obtained from Rocoil Limited, Harrogate, England, having mutual inductances in the range 2 to 5 $\mu$H have had resonant frequencies in the 10's of kHz. Thus reducing the mutual inductance by a factor of 10 in this example leads to an increase in bandwidth by approximately an order of magnitude.

2. Integrator in the Low Voltage (LV) Environment

In another preferred embodiment, a Rogowski coil is connected to a signal conditioning circuit, which in turn is connected to an IOPC. An integrator is located in the LV environment to recover a signal substantially proportional to the primary current. Locating the integrator in the LV environment has a few immediate consequences: 1) a signal representing the time derivative of the primary current (TDPC) is transmitted by the IOPC and therefore the IOPC must accommodate the dynamic range of the TDPC signal, 2) all signal distortions introduced by the IOPC and its receiver are integrated along with the TDPC signal, 3) the environmental conditions of the integrator are more readily controlled. These first two points are seen as disadvantages, where as the $3^{rd}$ point is an advantage; these points are discussed below.

This method involves applying the conditioned Rogowski coil signal representing the TDPC directly to the IOPC 18. A pair of complementary electrical signals are generated in the LV environment by an analyzer and light detection unit 38. The components of 38 may consist of a polarizing beam splitter 24 (used as an analyzer) and two photodetectors 30, 32 (see FIG. 4.) A signal processing unit 34 normalizes the complementary electrical signals to produce a composite signal which is substantially immune to common fluctuations in said pair of complementary electrical signals. A further function of 34 is to linearise the composite signal to compensate for the non-linear transfer-function of the IOPC. Yet another function of the signal processing unit 34 is to correct for temperature variations. The linearised composite signal is then integrated to recover a signal proportional to the primary current.

The dynamic range of the TDPC signal is inherently larger than the dynamic range of the primary current signal. The dynamic range required of the IOPC is therefore higher if integration is done in the LV environment. A consequence of integrating in the LV environment is that the high frequency noise of the optical system is attenuated thereby increasing the dynamic range of the optical system. Thus it appears that dynamic range is not an issue in the location of the integrator. In practice, locating the integrator in the LV environment can adversely affect the low frequency performance of the-system as indicated below.

A consequence of integrating in the LV environment is that parasitic additive signals as well as distortion potentially introduced by the components 20, 22, 18, 26, 38, 34 will also be integrated. Since the gain of an integrator is inversely proportional to frequency, low frequency signal corruption will be amplified in relation to a power frequency signal, while high frequency noise will be attenuated. Sources of low frequency signal corruption include: bias drift of the IOPC caused by changes in the light source's wavelength or rapid temperature changes of the IOPC, drift of voltage offsets in analogue amplifiers (contained in 34) and photodetectors 30, 32, and offsets caused by residual non-linearity contained in the linearised composite signal.

The severity of the low frequency signal corruption is inversely proportional to the integrator pole frequency, i.e. the lower frequency limit at which the integrator is still able to substantially integrate a signal. For example, an integrator pole frequency of 0.6 Hz will amplify frequencies at 0.6 Hz by a factor of approximately 100 in relation to a 60 Hz nominal power frequency signal. While this behavior simply follows from the definition of an integrator, it can be quite detrimental when a low frequency error signal is introduced at any point in the system after the Rogowski coil. (Note: a low frequency signal detected by the Rogowski coil would be attenuated with respect to a 60 Hz signal. The integrator would then reciprocally amplify the signal thus incurring no net amplification with respect to the 60 Hz power frequency signal.) Although low-frequency noise is a problem for the integrator, it has excellent suppression of high-frequency noise due to an integrator's small effective noise bandwidth.

Low frequency signal corruption can be filtered out for revenue metering applications and as such, integration in the LV environment is appropriate for metering applications. For relaying applications, it is desirable to minimize instantaneous error values (e.g. IEC 44–6,1992-03 "Requirements for protective current transformers for transient performance" specifies a 10% maximum instantaneous error.) Experimental results using an integrator at the output of the Signal Processing unit 34 (as would be the case with an integrator located in the LV environment) have demonstrated that the LV integrator is not the best choice for measurement at frequencies below the nominal power frequency. Instantaneous errors in the order of 10% were seen when measuring short duration (1 to 2 seconds) current levels of 10 times nominal current with an integrator pole frequency of 0.6 Hz. The source of these errors is the presence of integrated low frequency distortion. Preferably, the pole frequency for the LV integrator should not be much lower than a factor of 10 from the power frequency in order to keep instantaneous errors well below 10%. Since the integrator pole frequency sets the lower cut-off frequency for the current measurement, the low frequency cut-off of the instrument will be limited. The low frequency cut-off can be extended with the use of integration in the HV environment as discussed in the subsequent section.

The integrator for this application must be optimized to achieve the desired phase accuracy. For example, the international standard EEC 44-1, 1996, "Instrument Transformers Part 1: Current transformers" specifies 5 minute phase accuracy for the 0.1% accuracy class when metering at rated current. A single pole integrator with a pole frequency higher than approximately 0.09 Hz will have a phase displacement larger than 5 minutes at 60 Hz unless additional phase delay is added to compensate for the integrator. The transfer function of a phase compensator can be expressed in the frequency domain by:

$$C(f) = \frac{1 + \frac{if}{\alpha f_c}}{1 + \frac{if}{f_c}}$$

where i is the square root of −1, f is the frequency, $f_c$ is the pole frequency of the compensator, and α is used to control the amount of phase lag (α>1). The maximum phase lag as a function of α is given by:

$$\theta_{max} = \arcsin\left(\frac{1-\alpha}{1+\alpha}\right).$$

The phase lag of the compensator comes at the expense of further amplification of low frequency distortion (i.e. relative attenuation of the power frequency signal). By inspection, it is seen that the value of C(f) approaches 1/α when $f_c$<<f. α should therefore not be too large for this application. A good choice of α can be obtained by maximizing the gain-phase product of the compensator. This occurs approximately at α=2.5. Having specified α, the value $f_c$ is then chosen such that the combined phase delay of the integrator and compensator is substantially 90 degrees at the power frequency.

The integrator is in fact not a true integrator, but is characterized by a transfer function H(s) of the form:

$$H(s) = \frac{s}{s^2 + 2\zeta\Omega s + \Omega^2}$$

where s is the Laplace domain variable, ζ is the damping factor, and Ω is the natural frequency. The value of ζ should be approximately 1/sqrt(2) to give a flat frequency response. The value of Ω is then chosen to set the radian pole frequency of the integrator. Inspection of H(s) shows that the transfer function of this integrator has zero transmission at zero frequency. This is chosen to block residual DC offsets that could otherwise saturate the integrator.

Realization of the combined integrator/compensator transfer function can be done using analogue circuits, or by their equivalent digital circuits or algorithms. Digital transfer functions are obtained by converting the Laplace domain transfer function into a Z-domain transfer function using standard methods such as the Bilinear Z-Transform or the Impulse Invariant Method. Particular attention must be paid to the resolution of the digital calculations. The numerical resolution must be sufficient to represent the fraction of the pole frequency of the integrator divided by the digital sampling frequency. For example, a 100 kHz sampling frequency requires a digital resolution greater than 1 part in 100,000 to resolve a pole frequency of 1 Hz.

3. Rogowski coil with IOPC and Integrator in the High Voltage Environment

In another preferred embodiment, an integrator is located in the HV environment. The integrator is a passive type and thus able to operate without a power supply. The integrator is in fact not a true integrator, but is characterized by a transfer function H(f) of the form:

$$H(f) = \frac{1}{1 + i\frac{f}{f_0}}$$

where
  f is the electrical frequency,
  $f_0$ is the integrator pole location, and
  i is the square root of −1.

The value of $f_0$ is chosen according to the temperature and age stability of the integrator components and the desired overall measurement accuracy as will be described below.

The preferred integrator is the resistor and capacitor type since inductors with sufficiently large values exhibit excessive parasitic capacitance and resistance. For a resistor-capacitor integrator, the pole location is given by:

$$f_0 = \frac{1}{2\pi RC}$$

where
  R is the resistor value and
  C is the capacitor value.

Resistors with temperature coefficients at least as low as 0∀5H10$^{-6}$/EC are commercially available representing a ±0.025% change over a ±50°C temperature change, sufficient for keeping $f_0$ safely within ±0.1%.

Capacitors with similar temperature performance are not readily available. It is believed that the most temperature stable class designations are the Electronic Industries Association (EIA) COG designation and MIL NPO designation which specify $0\pm30\times10^{-6}/°C$. This corresponds to ±0.15% change over a ±50°C temperature change.

An example of a suitable resistor R is part no. HR5032N available from Precision Resistor Co. Inc. An example of a suitable capacitor for C is a ceramic capacitor having COG temperature stability such as that available from KEMET Electronics Corporation under part no. C522C184J1G5CA.

Combining the capacitor variation and the resistor variation, without using a temperature estimate, the uncertainty in $f_0$ will be bounded by ±0.175% over a ±50°C temperature change. The uncertainty may be reduced to less than ±0.1% by estimating the temperature to within ±25°C.

The optimum choice of the value of $f_0$ will now be discussed in relation to an uncertainty in $f_0$. FIG. 1 shows the resulting phase and magnitude uncertainty caused by a single pole integrator at nominal frequency for an uncertainty of ±0.175% in $f_0$ as a function of the integrator's pole location $f_0$ normalized by the nominal frequency $f_n$. According to FIG. 1b, the phase uncertainty at nominal frequency caused by the integrator can be maintained smaller than 1 minute by choosing the integrator's pole to be either roughly one tenth of the nominal frequency or smaller, or, ten times the nominal frequency or larger. It is preferable to choose a pole frequency satisfying one of these two conditions even if a temperature estimate is used to reduce the uncertainty in $f_0$. This will allow scaling factors to be used to correct for temperature induced fluctuations and will not require a dynamic filter in the LV environment to correct for temperature induced phase fluctuations. The preferred value of $f_0$ for a 0.3%, 7.8 minute phase accuracy class (IEEE Standard C57.13-1993) is approximately $f_0 \cdot f_n/10$ or less, regardless of whether temperature compensation is used. The preferred value of $f_0$ for a 0.1%, 5 minute phase accuracy class (IEC Std 44-1, 1996) is approximately $f_0 \cdot f_n \times 10$ or more if temperature compensation is not used, and $f_0 \cdot f_n/10$ or less if temperature compensation is used.

Figure 2:
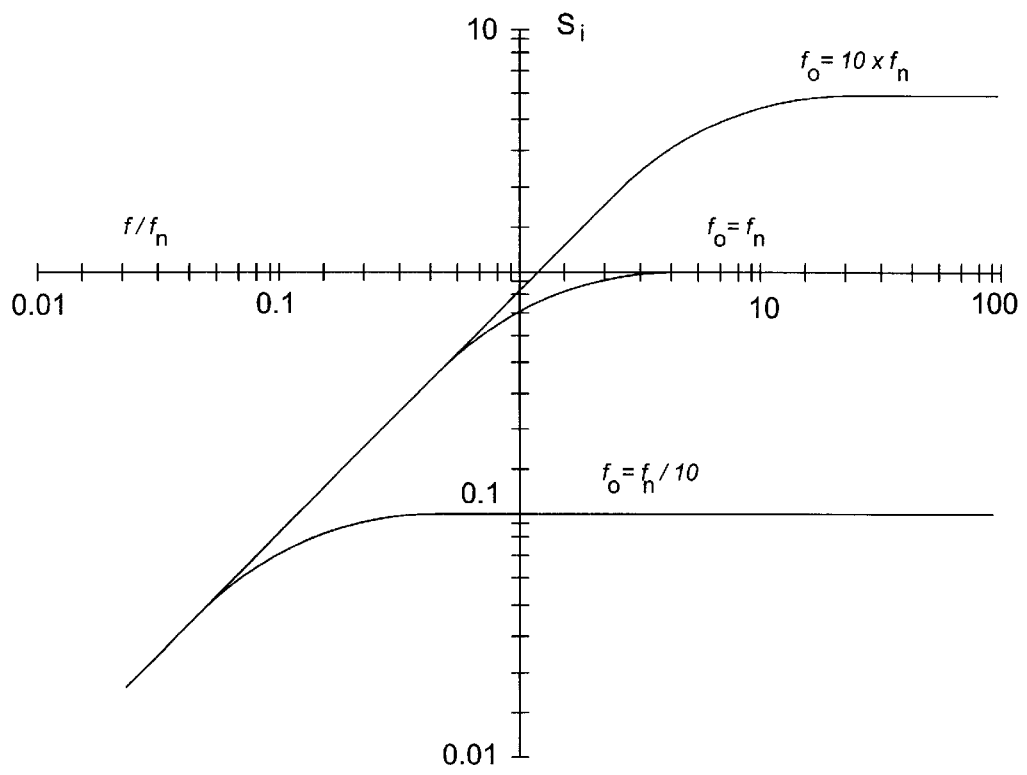
FIG. 2 shows the normalized signal magnitude $S_i$ of a Rogowski coil in combination with a single pole integrator as a function of normalized frequency for three pole frequencies, $f_0$.

For the case of $f_0 \cdot f_n \times 10$ or more, the signal applied to the IOPC will be substantially proportional the time derivative of the primary current for the nominal power frequency. In this case further integration in the LV environment will be required to recover the current signal. The case of integration in both the LV and HV environments is discussed in the following section. The reason why $f_0 \cdot f_n/10$ or less is preferred over $f_0 \cdot f_n \times 10$ or more is that the former will reduce or eliminate the need to further integrate the signal in the LV environment at frequencies less than the nominal power frequency. It is desirable to avoid integration in the LV environment at frequencies less than the nominal power frequency because this integration will lead to amplification of low frequency distortion as described above. FIG. 2 shows the normalized magnitude of the Rogowski coil and integrator combination output signal $S_i$ for three values of $f_0$. The curve corresponding to $f_0 = f_n/10$ maintains the flattest response around the nominal power frequency. If the case of $f_0 = f_n \times 10$ or larger is used, then the signal magnitude $S_i$ applied to the optical modulator at the nominal power frequency should be reduced to allow for the increased amplitude of the higher frequencies.

For the case $f_0 \cdot f_n/10$ or less, $f_0$ may not be arbitrarily small. The bandwidth of the integrator may be expanded to lower frequencies by decreasing $f_0$ but at the expense of increased attenuation. The sensitivity of the IOPC thus places a lower limit on $f_0$. Typical signal levels are given below. Examples for the case $f_0 \cdot f_n \times 10$ or more are given in the following section.

The implications of choosing a pole frequency $f_0$ within the region $f_n/10$ to $f_n \times 10$ will now be discussed. As shown in FIG. 1B, the phase uncertainty due to a single pole integrator for an uncertainty in pole location $f_0$ of 0.175% reaches a maximum of approximately 3 minutes at $f_0 = f_n$. While this value is within a 5 minute phase uncertainty, it is desirable to maintain the phase uncertainty from the integrator substantially below the allowable limit to accommodate phase uncertainty from other sources. A further reason to locate the integrator pole away from the nominal power frequency is to facilitate combining a HV located integrator with a LV located integrator. When two integrators are used, as discussed in the following section, deviations of their poles (and zeros) from nominal values will result in incomplete pole and zero cancellation. The resulting deviations in phase and magnitude of the combined integrators at nominal frequency can be reduced by locating the poles and zeros away from the nominal frequency.

The advantages of the integrator described above in which the pole location is chosen using the above criteria are:

Fully passive design in HV environment, doesn't require a power supply.

Greater interference immunity and robustness than active or digital integrators located in the HV environment.

The integrator is capable of providing metering accuracy using commercially available components.

Temperature compensation can be achieved by applying scale factors without using a dynamic phase compensating scheme.

Low frequency measurement performance is enhanced by reducing or eliminating amplification of low frequency signal corruption in the LV environment. (Applies to the case of $f_0 \approx f_n/10$ or less.)

When the passive integrator is used without further integration in the LV environment ($f_0 \approx f_n/10$ or less), the phase displacement of the passive integrator can be nulled at the nominal power frequency by using a phase compensating circuit. The same compensator transfer function used for the integrator in the LV environment can be used for the integrator located in the HV environment. Again, α should be roughly 2.5 to maximize the gain-phase product of the compensator to avoid excessive attenuation of the TDPC signal. The value of compensator pole locations $f_c$ is then chosen so that the combined phase delay of the integrator and compensator is substantially 90 degrees at the power frequency.

Figure 10:
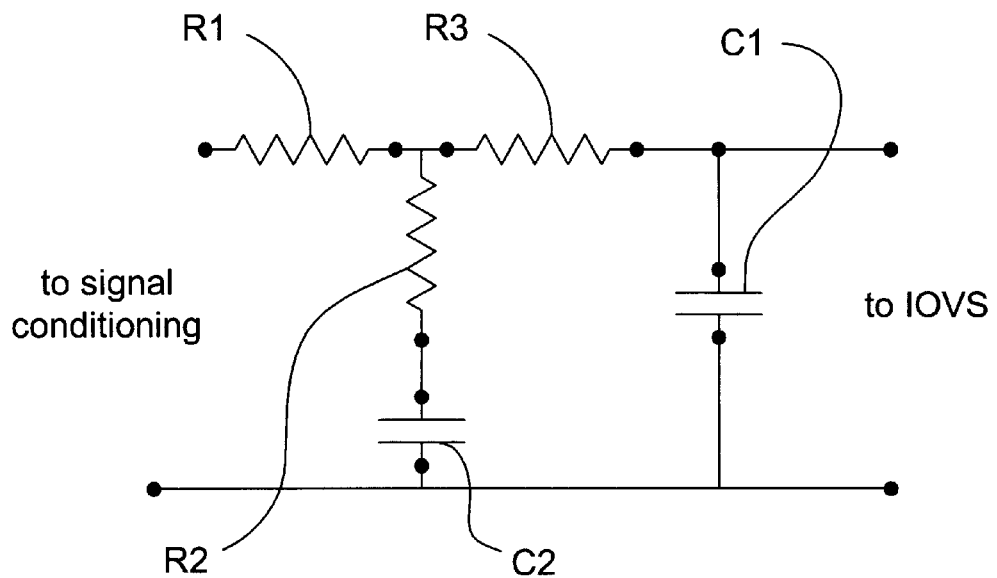
FIG. 10 is a schematic of a passive integrator with phase compensation for use in a HV environment.

A possible realization of a passive integrator with a phase compensator is shown in FIG. 10. Resistors R1, R2 and capacitor C2 primarily perform the phase compensating function, whereas resistor R3 and C1 primarily perform the integrating function. The components R1, R2, R3, C1 and C2 should be thermally stable. One skilled in the art of analogue circuit design will be able to choose values for these components to realize the transfer functions of the phase compensator and integrator.

The phase compensator may alternatively be located in the LV environment. Elimination of the compensator from FIG. 10 is achieved by removing R2 and C2. In this case, R1+R3=R, and C1=C. Realization of a phase compensator in the LV environment is straightforward for one skilled in the art of analogue or digital filter design. The compensator transfer function should still be chosen as described above.

An example follows of typical signal levels that would be employed. Half-wave voltages in the order of 20V are obtainable permitting a nominal integrator signal in the order of 250 mVp which allows a 20 times over-current to be sensed without exceeding 50% of the half-wave voltage. For a HV located integrator time constant of $f_0 \cdot f_n/60$, the Rogowski coil=s signal voltage will be nominally 60 times the integrator signal, or in the order of 15 Vp. A 20 times over-current at nominal frequency will therefore result in a 300 Vp Rogowski coil signal voltage which is easily insulated against. The power dissipation during a 20 times over-current condition will be less than 4.5 W for any load resistor $R_L$ (76) larger than 10 kΩ. This allows continuous 20 times over-currents to be measured without any special cooling means or special load resistor construction. High-frequency surges will result in larger Rogowski coil signal levels but can be clamped by a surge suppressing device (74) to protect the coil=s insulation as well as the integrator. The result is a forced limit on the maximum value of the time-derivative of the primary current that can be measured for a given Rogowski coil mutual inductance. For example, a 900 V clamp will result in an over-current, over-frequency product of 60 using the example given above.

4. Integration in Both HV and LV Environments

The integration of the TDPC signal need not be done in one location. Integration in the LV environment is prone to low frequency signal corruption amplification. The degree of corruption amplification resulting from the LV integrator is proportional to the ratio of the power frequency divided by the LV integrator's pole frequency. Ratios on the order of 100 have been found to be problematic; however, ratios on the order of 10, in our experience, lead to sufficiently stable results to maintain instantaneous errors well below 10%. This situation allows for some integration to be done in the LV environment without compromising the relaying accuracy. The advantage of splitting up the location of the integrator is that a smaller overall integrator pole frequency can be achieved without further signal attenuation in the integrator at HV, and without incurring significant low frequency signal corruption.

The simplest configuration of the dual location integrator is as follows. A passive integrator in the HV environment, without a phase compensator, integrates the TDPC signal from the high-frequency limit of the instrument down to the passive integrator's pole frequency $f_{HV}$. $f_{HV}$ should be either larger than 10 times the nominal power frequency, or smaller than one tenth of the nominal power frequency according to the method described above (see section on integrator in HV environment). An active or digital integrator located in the LV environment passes frequencies higher than $f_{HV}$, but integrates over frequencies between its pole frequency, $f_{LV}$ that is less than $f_{HV}$, and $f_{HV}$. A phase compensator located in the LV environment is then placed at a frequency close to $f_{LV}$ such that it nulls the overall phase of the instrument at the power frequency. Preferably, $f_{HV}$ is 10 or more times smaller than the nominal power frequency, and the ratio of $f_{HV}$ to $f_{LV}$ is preferably on the order of 10. Thus the low frequency signal corruption amplification degree of the LV integrator is on the order of 10, a tolerable level, and an extra factor of 10 can be used to either reduce the attenuation of the HV located integrator for a given low frequency measurement cut-off, or further decrease the overall integration pole frequency, $f_{LV}$, by a factor of 10. The LV and HV integrators are implemented as follows. The HV integrator is a single pole circuit which is obtained from FIG. 10 by removing R2 and C2. In this case, R1+R3=R, and C1=C, and the pole radian frequency is given by 2 pi $f_{HV}$=1/(R C). The transfer function of the integrator located in the LV, in the Laplace domain, is of the form:

$$H(s) = \frac{s}{s^2 + 2\zeta(2\pi f_{LV})s + (2\pi f_{LV})^2} \frac{(s + 2\pi f_{HV})}{1}$$

where s is the Laplace domain variable, $\zeta$ is the damping factor. The value of $\zeta$ should be approximately $1/\sqrt{2}$ to give a flat frequency response. Realization of the LV integrator transfer function can be done using analogue circuits, or by their equivalent digital circuits or algorithms. A phase compensator may also be incorporated into the LV integrator. The purpose of the compensator and its transfer function are as described previously (integrator in LV environment).

Other configurations may also be used which split the integration over more than two regions. As an example for a 60 Hz power frequency, integration is performed as follows listed in order of increasing frequency: the HV located integrator integrates from 0.6 to 6 Hz, the LV located integrator integrates from 6 Hz to 600 Hz, and the HV integrator also integrates from 600 Hz to the high-frequency limit of the instrument. This configuration provides a lower cut-off frequency (pole frequency) that is 100 times below the nominal power frequency, yet the attenuation of the TDPC at 60 Hz due to the HV located integrator is only a factor of 10, and the low frequency signal corruption amplification degree of the LV located integrator is also 10. This example gives the same figures of merit as the one outlined in the previous paragraph, but with the added benefit that the high-frequency noise of the optical system is attenuated by a factor of approximately 10 due to the reduced effective noise bandwidth of the LV located integrator. The reason for using the HV integrator as opposed to the LV integrator to integrate frequencies above 600 Hz is to relax the requirements of the signal processing unit. Doing so will reduce the rise time of a fast transient (f>600 Hz) seen by the analogue to digital converters, reducing the possibility of aliasing, and will also reduce the signal amplitude applied to the IOPC during a fast transient, reducing the possibility of exceeding the half-wave voltage of the IOPC. Implementation of this example is as follows.

The HV integrator in this example contains two poles and one zero, just as in the case of a single pole passive integrator with the compensator. Thus the schematic in FIG. 10 can be used to realize the HV integrator of the present example. Component values are chosen to obtain the desired transfer function. For the present example, one pole of the transfer function is at 0.6 Hz, the zero is located at 6 Hz, and the remaining pole is located at 600 Hz. R1, R2, R3, C1, and C2 must all be thermally stable components. The LV integrator for the present example requires one pole at 6 Hz and one zero at 600 Hz. This transfer function is preferably realized using active components or digitally as part of the signal processing block (34). When the LV integrator transfer function is realized by the signal processing block (34), normalization of the photodetector (32, 30) signals must be performed prior to the step of integrating in the LV. This is discussed further below (see section on Signal Processing in the Low Voltage Environment.) The physical implementation of the LV integrator will be straight forward to one skilled in the art of analogue or digital filter design.

Signal Processing in the Low Voltage Environment

The IOPC is connected to the LV environment by optical fibers, which provide electrical isolation. The IOPC gives two anti-phase optical signals $P_1$ and $P_2$ that are detected by two photodetectors which generate two electrical signals $S_1$ and $S_2$.

In FIG. 7, the integrator 16A is located after signal processing 34. The reason for this and the function of the signal processing 34 will now be described.

One function of the signal processing unit 34 is to calculate a normalized composite signal of $S_1$ and $S_2$ according to the formula:

$$S_{norm} = \frac{S_1 - kS_2}{S_1 + kS_2}$$

where $S_1$ and $S_2$ are the two electrical signals obtained from the two photodetectors (30, 32), and k is a parameter to accommodate any difference in the gains of the signals $S_1$ and $S_2$. This normalization method, with the exception of the k factor, is described in U.S. Pat. No. 5,029,273. This normalization scheme allows power variations which are common to the signals $S_1$ and $S_2$ to be cancelled out, thus reducing false signals caused by power fluctuations of the optical source or any other components common to $S_1$ and $S_2$. This normalization is performed by the signal processing unit 34 and must occur prior to any integration. Errors will result if the integration is performed prior to applying the normalization scheme since unwanted fluctuations in the integral of $S_1-kS_2$ will not scale with unwanted fluctuations in the integral of $S_1+kS_2$. For this reason, the integrator is placed after the signal processing unit 34 in FIG. 7.

A further function of the signal processing unit 34 is to form a linearised signal $S_{lin}$ from the normalized composite signal to compensate for the sinusoidal transfer function of the integrated-optic modulator. This may be accomplished by applying an arcsine function to the normalized composite signal as:

$$S_{lin} = \sin^{-1}(S_{norm}/\gamma)$$

where $\gamma$ is greater than zero and less than or equal to 1 and is related to the contrast ratio of the IOPC in combination with the light source 20. Alternatively, a polynomial approximation of the inverse IOPC transfer function may be used. The time averaged value of the linearised signal, equivalent to the relative optical bias, is then subtracted from the linearised signal and the result is scaled as required for temperature compensation (see below) or other purposes to obtain the output signal 40.

Figure 13:
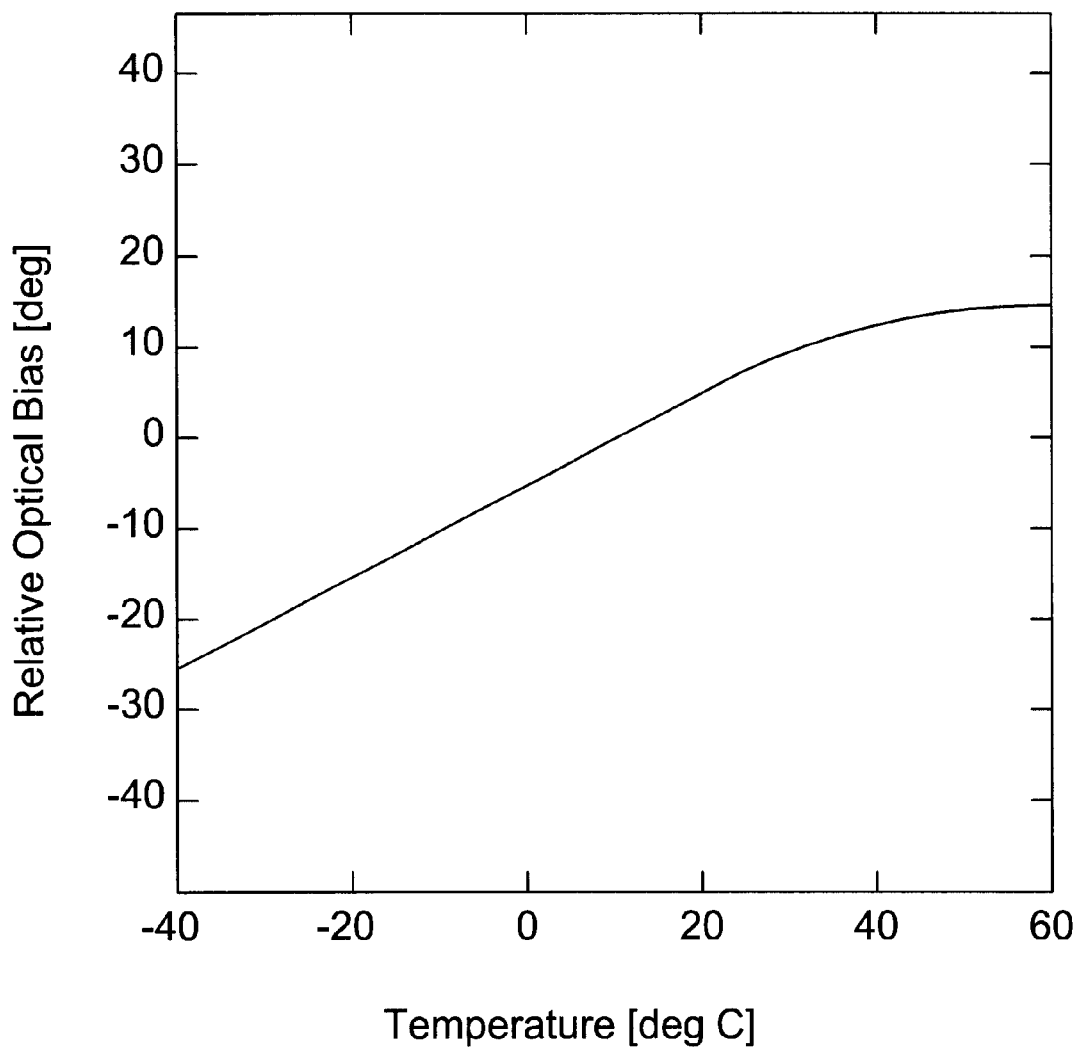
FIG. 13 is illustrative of a variation in relative optical bias as a function of temperature for an IOPC.

A further function of the signal processing unit 34 is to provide an output signal 40 that is substantially immune to temperature fluctuations of the current sensor. FIG. 13 is illustrative of a typical variation in relative optical bias as a function of temperature for an IOPC. By characterizing the relationship between the temperature and relative optical bias, the temperature of components located in the HV environment may be estimated by using an electronic lookup table that is stored in the signal processing unit 34. The temperature estimate may then be converted into an appropriate scale factor by a second lookup table. The second lookup table is generated to cancel the temperature induced variation in the output signal 40 in the absence of compensation. Alternatively, a single lookup table may be used that directly relates relative optical bias to the appropriate scale factor.

Having described the invention, modifications will be evident to those skilled in the art without departing from the spirit of the invention as defined in the appended claims.

We claim:

1. A method for measuring current in a high voltage current carrier comprising:
   generating a low voltage signal representative of said current in said high voltage carrier;
   applying said low voltage signal to an integrated-optic voltage sensor located in a high voltage environment adjacent to said high voltage current carrier to produce a modulated optical signal representative of said current being measured;
   conducting said optical signal to a low voltage environment insulated from said high voltage environment;
   processing said optical signal to provide an electrical output signal representative of said current; and
   electrical signal filtering at least one of
   (i) said low voltage signal in said high voltage environment prior to application to said integrated-optic voltage sensor by way of an electrical signal filter having a first selected transfer function and over a selected filtering frequency range, and
   (ii) said electrical output signal in said low voltage environment by way of an electrical signal filter having a second selected transfer function over a selected filtering frequency range.

2. A method for measuring current in a high voltage current carrier as defined in claim 1 wherein the step of generating said low voltage signal includes using a Rogowski coil surrounding the high voltage carrier.

3. A method for measuring current in a high voltage current carrier as defined in claim 1 wherein the step of filtering serves to integrate over at least one frequency range.

4. A method for measuring current in a high voltage current carrier as defined in claim 3 wherein the step of generating said low voltage signal includes using a Rogowski coil surrounding the high voltage carrier.

5. A method for measuring current in a high voltage current carrier as defined in claim 1 wherein only said electrical signal is filtered.

6. A method for measuring current in a high voltage current carrier as defined in claim 5 wherein the step of generating said low voltage signal includes using a Rogowski coil surrounding the high voltage carrier.

7. A method for measuring current in a high voltage current carrier as defined in claim 2 wherein the step of filtering serves to integrate over at least one frequency range.

8. A method for measuring current in a high voltage current carrier as defined in claim 7 wherein the step of generating said low voltage signal includes using a Rogowski coil surrounding the high voltage carrier.

9. A method for measuring current in a high voltage current carrier as defined in claim 1 wherein only said electrical output signal is filtered.

10. A method for measuring current in a high voltage current carrier as defined in claim 9 wherein the step of generating said low voltage signal includes using a Rogowski coil surrounding the high voltage carrier.

11. A method for measuring current in a high voltage current carrier as defined in claim 9 wherein said step of filtering serves to integrate over at least one frequency range.

12. A method for measuring current in a high voltage current carrier as defined in claim 11 wherein the step of generating said low voltage signal includes using a Rogowski coil surrounding the high voltage carrier.

13. A method for measuring current in a high voltage current carrier as defined in claim 1 wherein both said low voltage signal and said electrical output signal are filtered.

14. A method for measuring current in a high voltage current carrier as defined in claim 13 wherein the step of generating said low voltage signal includes using a Rogowski coil surrounding the high voltage carrier.

15. A method for measuring current in a high voltage current carrier as defined in claim 13 wherein said generating said low voltage signal includes using a Rogowski coil surrounding the high voltage carrier.

16. A method for measuring current in a high voltage current carrier as defined in claim 4 wherein said step of filtering serves to integrate over at least one frequency range.

17. A method for measuring current in a high voltage current carrier as defined in claim 16 wherein the step of generating said low voltage signal includes using a Rogowski coil surrounding the high voltage carrier.

18. A method for measuring current in a high voltage current carrier as defined in any one of claims 1 through 17 further includes the step of compensating for temperature induced variations of components located in the high voltage environment.

19. An apparatus for measuring current in a high voltage current carrier comprising:
   a current-to-voltage transducer responsive to said current in said high voltage current carrier for generating a low voltage electrical signal representative of said current in said high voltage current carrier;
   a first electrical signal integrating filter having a first selected transfer function responsive to said low voltage electrical signal for deriving a filtered low voltage electrical signal;
   an integrated-optic voltage sensor responsive to said filtered low voltage electrical signal for deriving an optical signal indicative of said current intended to be measured; and
   signal processing means responsive to said optical signal for deriving a signal processing output electrical signal indicative of said current in said high voltage current carrier.

20. An apparatus as defined in claim 19 wherein said current-to-voltage transducer is a resistive shunt.

21. An apparatus as defined in claim 19 wherein said current-to-voltage transducer is a current transformer with a load resistor.

22. An apparatus as defined in claim 19 wherein said current-to-voltage transducer is a Rogowski coil.

23. An apparatus as defined in claim 22 wherein said integrating filter is a passive integrator for integrating said low voltage first electrical signal over at least one range of frequency.

24. An apparatus as defined in claim 22 wherein:
   said first integrating filter is operable for integrating said low voltage electrical signal over at least one portion of the operating bandwidth of said apparatus;
   a second filtering means for integrating said signal processing electrical output signal over at least one range of frequency so as to derive a filtered electrical output signal representative of said current in said high voltage current carrier; and
   wherein said second filtering means is operable for integrating said third electrical signal over a different portion of said operating bandwidth than that of said first integrating filter.

25. An apparatus as defined in claim 22 and further comprising a second filtering means for integrating said output electrical signal over at least one range of frequency so as to derive a second electrical signal representative of said current in said high voltage current carrier.

26. An apparatus as defined in claim 25 wherein said integrating filter is a passive integrator for integrating said low voltage first electrical signal over at least one range of frequency.

27. An apparatus as defined in any one of claims 19 to 24 wherein said integrated-optic voltage sensor is an IOPC.

28. A method for measuring current in a high voltage current carrier comprising:
   generating a low voltage signal representative of said current in said high voltage current carrier;
   signal conditioning said low voltage signal and providing a conditioned signal;
   applying said condition signal to an integrated-optic voltage sensor located in a high voltage environment adjacent to said high voltage current carrier to produce a modulated optical signal representative of said current being measured;
   conducting said optical signal to a low voltage environment insulated from said high voltage environment;
   processing said optical signal to provide an electrical signal representative of said current; and
   filtering at least one of said low voltage signal in said high voltage environment prior to application to said integrated-optic voltage sensor or said electrical signal in said low voltage environment.

29. A method for measuring current in a high voltage current carrier as defined in claim 28 wherein both said low voltage signal and said electrical signal are filtered.

30. A method for measuring current in a high voltage current carrier as defined in claim 28 wherein said generating said low voltage signal includes using a Rogowski coil surrounding the high voltage carrier.

31. A method for measuring current in a high voltage current carrier as defined in claim 28 wherein said filtering integrates over at least one range of frequency.

32. A method for measuring current in a high voltage current carrier as defined in claim 31 wherein said generating said low voltage signal includes using a Rogowski coil surrounding the high voltage carrier.

33. A method for measuring current in a high voltage current carrier as defined in claim 28 wherein only said low voltage signal is filtered.

34. A method for measuring current in a high voltage current carrier as defined in claim 33 wherein said generating said low voltage signal includes using a Rogowski coil surrounding the high voltage carrier.

35. A method for measuring current in a high voltage current carrier as defined in claim 33 wherein said filtering integrates over at least one range of frequency.

36. A method for measuring current in a high voltage current carrier as defined in claim 35 wherein said generating said low voltage signal includes using a Rogowski coil surrounding the high voltage carrier.

37. A method for measuring current in a high voltage current carrier as defined in claim 28 wherein only said electrical signal is filtered.

38. A method for measuring current in a high voltage current carrier as defined in claim 37 wherein said generating said low voltage signal includes using a Rogowski coil surrounding the high voltage carrier.

39. A method for measuring current in a high voltage current carrier as defined in claim 37 wherein said filtering integrates over at least one range of frequency.

40. A method for measuring current in a high voltage current carrier as defined in claim 39 wherein said generating said low voltage signal includes using a Rogowski coil surrounding the high voltage carrier.

41. A method for measuring current in a high voltage current carrier as defined in claim 37 wherein said filtering integrates over at least one range of frequency.

42. A method for measuring current in a high voltage current carrier as defined in claim 40 wherein said generating said low voltage signal includes using a Rogowski coil surrounding the high voltage carrier.

43. A method for measuring current in a high voltage current carrier as defined in any one of claims 28 through 42 further including compensating for temperature induced variations of components located in the high voltage environment.

44. An apparatus measuring current in a high voltage current carrier comprising:

a current-to-voltage transducer responsive to said current in said high voltage current carrier for generating a low voltage electrical signal representative of said current in said high voltage current carrier;

an integrated-optic voltage sensor responsive to said filtered low voltage electrical signal for deriving an optical signal indicative of said current intended to be measured;

signal processing means responsive to said optical signal for deriving a signal processing output electrical signal indicative of said current in said high voltage current carrier; and a first integrating filter having a first selected transfer function responsive to said signal processing output electrical signal for deriving a filtered output electrical signal indicative the current to be sensed.

* * * * *